United States Patent
Shanmugasundram et al.

(10) Patent No.: US 8,070,909 B2
(45) Date of Patent: Dec. 6, 2011

(54) FEEDBACK CONTROL OF CHEMICAL MECHANICAL POLISHING DEVICE PROVIDING MANIPULATION OF REMOVAL RATE PROFILES

(75) Inventors: Arulkumar P. Shanmugasundram, Sunnyvale, CA (US); Alexander T. Schwarm, Austin, TX (US); Gopalakrishna B. Prabhu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/645,989

(22) Filed: Dec. 27, 2006

(65) Prior Publication Data
US 2007/0102116 A1 May 10, 2007

Related U.S. Application Data

(62) Division of application No. 09/943,955, filed on Aug. 31, 2001, now Pat. No. 7,160,739.

(60) Provisional application No. 60/298,878, filed on Jun. 19, 2001.

(51) Int. Cl.
*H01L 21/304* (2006.01)
*B24B 37/00* (2006.01)
*B24B 37/04* (2006.01)

(52) U.S. Cl. .......... 156/345.13; 156/345.15; 156/345.22

(58) Field of Classification Search .............. 156/345.15, 156/345.12, 345.22, 345.13
See application file for complete search history.

(56) References Cited

U.S. PATENT DOCUMENTS

| | | | |
|---|---|---|---|
| 3,205,485 A | 9/1965 | Noltingk | |
| 3,229,198 A | 1/1966 | Libby | |
| 3,767,900 A | 10/1973 | Chao et al. | |
| 3,920,965 A | 11/1975 | Sohrwardy | |
| 4,000,458 A | 12/1976 | Miller et al. | |
| 4,207,520 A | 6/1980 | Flora et al. | |
| 4,209,744 A | 6/1980 | Gerasimov et al. | |
| 4,302,721 A | 11/1981 | Urbanek et al. | |

(Continued)

FOREIGN PATENT DOCUMENTS
CA      2050247     8/1991
(Continued)

OTHER PUBLICATIONS

Notice of Allowance for U.S. Appl. No. 10/135,451, mailed Nov. 16, 2009. (P010).

(Continued)

*Primary Examiner* — Sylvia R. MacArthur
(74) *Attorney, Agent, or Firm* — Blakely, Sokoloff, Taylor & Zafman LLP

(57) ABSTRACT

A method of controlling surface non-uniformity of a wafer in a polishing operation includes (a) providing a model for a wafer polishing that defines a plurality of regions on a wafer and identifies a wafer material removal rate in a polishing step of a polishing process for each of the regions, wherein the polishing process comprises a plurality of polishing steps, (b) polishing a wafer using a first polishing recipe based upon an incoming wafer thickness profile, (c) determining a wafer thickness profile for the post-polished wafer of step (b), and (d) calculating an updated polishing recipe based upon the wafer thickness profile of step (c) and the model of step (a) to maintain a target wafer thickness profile. The model can information about the tool state to improve the model quality. The method can be used to provide feedback to a plurality of platen stations.

16 Claims, 8 Drawing Sheets

U.S. PATENT DOCUMENTS

| | | |
|---|---|---|
| 4,368,510 A | 1/1983 | Anderson |
| 4,609,870 A | 9/1986 | Lale et al. |
| 4,616,308 A | 10/1986 | Morshedi et al. |
| 4,663,703 A | 5/1987 | Axelby et al. |
| 4,698,766 A | 10/1987 | Entwistle et al. |
| 4,717,596 A | 1/1988 | Barbee et al. |
| 4,750,141 A | 6/1988 | Judell et al. |
| 4,755,753 A | 7/1988 | Chern |
| 4,757,259 A | 7/1988 | Charpentier |
| 4,796,194 A | 1/1989 | Atherton |
| 4,901,218 A | 2/1990 | Cornwell |
| 4,938,600 A | 7/1990 | Into |
| 4,957,605 A | 9/1990 | Hurwitt et al. |
| 4,967,381 A | 10/1990 | Lane et al. |
| 4,974,543 A | 12/1990 | Jansen |
| 5,089,970 A | 2/1992 | Lee et al. |
| 5,108,570 A | 4/1992 | Wang |
| 5,208,765 A | 5/1993 | Turnbull |
| 5,220,517 A | 6/1993 | Sierk et al. |
| 5,226,118 A | 7/1993 | Baker et al. |
| 5,231,585 A | 7/1993 | Kobayashi et al. |
| 5,236,868 A | 8/1993 | Nulman |
| 5,240,552 A | 8/1993 | Yu et al. |
| 5,260,868 A | 11/1993 | Gupta et al. |
| 5,270,222 A | 12/1993 | Moslehi |
| 5,283,141 A | 2/1994 | Yoon et al. |
| 5,295,242 A | 3/1994 | Mashruwala et al. |
| 5,309,221 A | 5/1994 | Fischer et al. |
| 5,329,463 A | 7/1994 | Sierk et al. |
| 5,338,630 A | 8/1994 | Yoon et al. |
| 5,347,446 A | 9/1994 | Iino et al. |
| 5,367,624 A | 11/1994 | Cooper |
| 5,369,544 A | 11/1994 | Mastrangelo |
| 5,375,064 A | 12/1994 | Bollinger |
| 5,398,336 A | 3/1995 | Tantry et al. |
| 5,402,367 A | 3/1995 | Sullivan et al. |
| 5,408,405 A | 4/1995 | Mozumder et al. |
| 5,410,473 A | 4/1995 | Kaneko et al. |
| 5,420,796 A | 5/1995 | Weling et al. |
| 5,427,878 A | 6/1995 | Corliss |
| 5,444,837 A | 8/1995 | Bomans et al. |
| 5,469,361 A | 11/1995 | Moyne |
| 5,485,082 A | 1/1996 | Wisspeintner et al. |
| 5,490,097 A | 2/1996 | Swenson et al. |
| 5,495,417 A | 2/1996 | Fuduka et al. |
| 5,497,316 A | 3/1996 | Sierk et al. |
| 5,497,381 A | 3/1996 | O'Donoghue et al. |
| 5,503,707 A | 4/1996 | Maung et al. |
| 5,508,947 A | 4/1996 | Sierk et al. |
| 5,511,005 A | 4/1996 | Abbe et al. |
| 5,519,605 A | 5/1996 | Cawlfield |
| 5,525,808 A | 6/1996 | Irie et al. |
| 5,526,293 A | 6/1996 | Mozumder et al. |
| 5,534,289 A | 7/1996 | Bilder et al. |
| 5,535,128 A | 7/1996 | Laube et al. |
| 5,541,510 A | 7/1996 | Danielson |
| 5,546,179 A * | 8/1996 | Cheng ............................ 356/73 |
| 5,546,312 A | 8/1996 | Mozumder et al. |
| 5,553,195 A | 9/1996 | Meijer |
| 5,586,039 A | 12/1996 | Hirsch et al. |
| 5,599,423 A | 2/1997 | Parker et al. |
| 5,602,492 A | 2/1997 | Cresswell et al. |
| 5,603,707 A | 2/1997 | Trombetta et al. |
| 5,617,023 A | 4/1997 | Skalski |
| 5,621,241 A | 4/1997 | Jain |
| 5,627,083 A | 5/1997 | Tounai |
| 5,629,216 A | 5/1997 | Wijaranakula et al. |
| 5,642,296 A | 6/1997 | Saxena |
| 5,646,870 A | 7/1997 | Krivokapic et al. |
| 5,649,169 A | 7/1997 | Berezin et al. |
| 5,654,903 A | 8/1997 | Reitman et al. |
| 5,655,951 A | 8/1997 | Meikle et al. |
| 5,657,254 A | 8/1997 | Sierk et al. |
| 5,660,895 A | 8/1997 | Lee et al. |
| 5,661,669 A | 8/1997 | Mozumder et al. |
| 5,663,797 A | 9/1997 | Sandhu |
| 5,664,987 A | 9/1997 | Renteln |
| 5,664,990 A | 9/1997 | Adams et al. .................. 451/60 |
| 5,665,199 A | 9/1997 | Sahota et al. |
| 5,665,214 A | 9/1997 | Iturralde |
| 5,666,297 A | 9/1997 | Britt et al. |
| 5,667,424 A | 9/1997 | Pan |
| 5,674,787 A | 10/1997 | Zhao et al. |
| 5,694,325 A | 12/1997 | Fukuda et al. |
| 5,695,810 A | 12/1997 | Dubin et al. |
| 5,698,989 A | 12/1997 | Nulman |
| 5,711,843 A | 1/1998 | Jahns |
| 5,719,495 A | 2/1998 | Moslehi |
| 5,719,796 A | 2/1998 | Chen |
| 5,733,171 A * | 3/1998 | Allen et al. ...................... 451/5 |
| 5,735,055 A | 4/1998 | Hochbein et al. |
| 5,740,429 A | 4/1998 | Wang et al. |
| 5,751,582 A | 5/1998 | Saxena et al. |
| 5,754,297 A | 5/1998 | Nulman |
| 5,761,064 A | 6/1998 | La et al. |
| 5,761,065 A | 6/1998 | Kittler et al. |
| 5,764,543 A | 6/1998 | Kennedy |
| 5,777,901 A | 7/1998 | Berezin et al. |
| 5,787,021 A | 7/1998 | Samaha |
| 5,787,269 A | 7/1998 | Hyodo |
| 5,808,303 A | 9/1998 | Schlagheck et al. |
| 5,812,407 A | 9/1998 | Sato et al. |
| 5,823,854 A | 10/1998 | Chen |
| 5,824,599 A | 10/1998 | Schacham-Diamand et al. |
| 5,825,356 A | 10/1998 | Habib et al. |
| 5,825,913 A | 10/1998 | Rostami et al. |
| 5,828,778 A | 10/1998 | Hagi et al. |
| 5,831,851 A | 11/1998 | Eastburn et al. |
| 5,832,224 A | 11/1998 | Fehskens et al. |
| 5,838,595 A | 11/1998 | Sullivan et al. |
| 5,838,951 A | 11/1998 | Song |
| 5,844,554 A | 12/1998 | Geller et al. |
| 5,857,258 A | 1/1999 | Penzes et al. |
| 5,859,777 A | 1/1999 | Yokoyama et al. |
| 5,859,964 A | 1/1999 | Wang et al. |
| 5,859,975 A | 1/1999 | Brewer et al. |
| 5,862,054 A | 1/1999 | Li |
| 5,863,807 A | 1/1999 | Jang et al. |
| 5,867,389 A | 2/1999 | Hamada et al. |
| 5,870,306 A | 2/1999 | Harada |
| 5,871,805 A | 2/1999 | Lemelson |
| 5,874,345 A | 2/1999 | Coronel et al. |
| 5,883,437 A | 3/1999 | Maruyama et al. |
| 5,888,120 A | 3/1999 | Doran |
| 5,889,991 A | 3/1999 | Consolatti et al. |
| 5,901,313 A | 5/1999 | Wolf et al. |
| 5,903,455 A | 5/1999 | Sharpe, Jr. et al. |
| 5,910,011 A | 6/1999 | Cruse |
| 5,910,846 A | 6/1999 | Sandhu |
| 5,912,678 A | 6/1999 | Saxena et al. |
| 5,916,016 A | 6/1999 | Bothra |
| 5,923,553 A | 7/1999 | Yi |
| 5,926,690 A | 7/1999 | Toprac et al. |
| 5,930,138 A | 7/1999 | Lin et al. |
| 5,937,323 A | 8/1999 | Orczyk et al. |
| 5,940,300 A | 8/1999 | Ozaki |
| 5,943,237 A | 8/1999 | Van Boxem |
| 5,943,550 A | 8/1999 | Fulford, Jr. et al. |
| 5,960,185 A | 9/1999 | Nguyen |
| 5,960,214 A | 9/1999 | Sharpe, Jr. et al. |
| 5,961,369 A | 10/1999 | Bartels et al. |
| 5,963,881 A | 10/1999 | Kahn et al. |
| 5,975,994 A | 11/1999 | Sandhu et al. |
| 5,978,751 A | 11/1999 | Pence et al. |
| 5,982,920 A | 11/1999 | Tobin, Jr. et al. |
| 6,002,989 A | 12/1999 | Shiba et al. |
| 6,012,048 A | 1/2000 | Gustin et al. |
| 6,017,771 A | 1/2000 | Yang et al. |
| 6,036,349 A | 3/2000 | Gombar |
| 6,037,664 A | 3/2000 | Zhao et al. |
| 6,041,263 A | 3/2000 | Boston et al. |
| 6,041,270 A | 3/2000 | Steffan et al. |
| 6,054,379 A | 4/2000 | Yau et al. |
| 6,059,636 A | 5/2000 | Inaba et al. |
| 6,064,759 A | 5/2000 | Buckley et al. |
| 6,072,313 A | 6/2000 | Li et al. |
| 6,074,277 A * | 6/2000 | Arai ................................ 451/8 |

| Patent No. | Date | Name |
|---|---|---|
| 6,074,443 A | 6/2000 | Venkatesh et al. |
| 6,074,517 A | 6/2000 | Taravade .................. 156/345.13 |
| 6,077,412 A | 6/2000 | Ting et al. |
| 6,078,845 A | 6/2000 | Friedman |
| 6,094,688 A | 7/2000 | Mellen-Garnett et al. |
| 6,096,649 A | 8/2000 | Jang |
| 6,097,887 A | 8/2000 | Hardikar et al. |
| 6,100,195 A | 8/2000 | Chan et al. |
| 6,108,092 A | 8/2000 | Sandhu |
| 6,111,634 A | 8/2000 | Pecen et al. |
| 6,112,130 A | 8/2000 | Fukuda et al. |
| 6,113,462 A * | 9/2000 | Yang ................................. 451/5 |
| 6,114,238 A | 9/2000 | Liao |
| 6,123,983 A | 9/2000 | Smith, Jr. et al. |
| 6,127,263 A | 10/2000 | Parikh |
| 6,128,016 A | 10/2000 | Coelho et al. |
| 6,136,163 A | 10/2000 | Cheung et al. |
| 6,141,660 A | 10/2000 | Bach et al. |
| 6,143,646 A | 11/2000 | Wetzel |
| 6,148,099 A | 11/2000 | Lee et al. |
| 6,148,239 A | 11/2000 | Funk et al. |
| 6,148,246 A | 11/2000 | Kawazome |
| 6,150,270 A | 11/2000 | Matsuda et al. |
| 6,157,864 A | 12/2000 | Schwenke et al. |
| 6,159,073 A | 12/2000 | Wiswesser et al. ............... 451/6 |
| 6,159,075 A | 12/2000 | Zhang |
| 6,159,644 A | 12/2000 | Satoh et al. |
| 6,161,054 A | 12/2000 | Rosenthal et al. |
| 6,169,931 B1 | 1/2001 | Runnels |
| 6,172,756 B1 | 1/2001 | Chalmers et al. |
| 6,173,240 B1 | 1/2001 | Sepulveda et al. |
| 6,175,777 B1 | 1/2001 | Kim |
| 6,178,390 B1 | 1/2001 | Jun |
| 6,181,013 B1 | 1/2001 | Liu et al. |
| 6,183,345 B1 | 2/2001 | Kamono et al. |
| 6,185,324 B1 | 2/2001 | Ishihara et al. |
| 6,191,864 B1 | 2/2001 | Sandhu |
| 6,192,291 B1 | 2/2001 | Kwon |
| 6,194,231 B1 | 2/2001 | Ho-Cheng et al. |
| 6,197,604 B1 | 3/2001 | Miller et al. |
| 6,201,208 B1 | 3/2001 | Wendt et al. |
| 6,204,165 B1 | 3/2001 | Ghoshal |
| 6,210,745 B1 | 4/2001 | Gaughan et al. |
| 6,210,983 B1 | 4/2001 | Atchison et al. |
| 6,211,094 B1 | 4/2001 | Jun et al. |
| 6,212,961 B1 | 4/2001 | Dvir |
| 6,214,734 B1 | 4/2001 | Bothra et al. |
| 6,217,412 B1 | 4/2001 | Campbell et al. |
| 6,217,658 B1 | 4/2001 | Orczyk et al. |
| 6,219,711 B1 | 4/2001 | Chari |
| 6,222,936 B1 | 4/2001 | Phan et al. |
| 6,226,563 B1 | 5/2001 | Lim |
| 6,226,792 B1 | 5/2001 | Goiffon et al. |
| 6,228,280 B1 | 5/2001 | Li et al. |
| 6,230,069 B1 | 5/2001 | Campbell et al. |
| 6,232,236 B1 | 5/2001 | Shan et al. |
| 6,236,903 B1 | 5/2001 | Kim et al. |
| 6,237,050 B1 | 5/2001 | Kim et al. |
| 6,240,330 B1 | 5/2001 | Kurtzberg et al. |
| 6,240,331 B1 | 5/2001 | Yun |
| 6,245,581 B1 | 6/2001 | Bonser et al. |
| 6,246,972 B1 | 6/2001 | Klimasauskas |
| 6,248,602 B1 | 6/2001 | Bode et al. |
| 6,249,712 B1 | 6/2001 | Boiquaye |
| 6,252,412 B1 | 6/2001 | Talbot et al. |
| 6,253,366 B1 | 6/2001 | Mutschler, III |
| 6,259,160 B1 | 7/2001 | Lopatin et al. |
| 6,263,255 B1 | 7/2001 | Tan et al. |
| 6,268,270 B1 | 7/2001 | Scheid et al. |
| 6,271,670 B1 | 8/2001 | Caffey |
| 6,276,989 B1 | 8/2001 | Campbell et al. |
| 6,277,014 B1 | 8/2001 | Chen et al. |
| 6,278,899 B1 | 8/2001 | Piche et al. |
| 6,280,289 B1 | 8/2001 | Wiswesser et al. |
| 6,281,127 B1 | 8/2001 | Shue |
| 6,284,622 B1 | 9/2001 | Campbell et al. |
| 6,287,879 B1 | 9/2001 | Gonzales et al. |
| 6,290,572 B1 | 9/2001 | Hofmann |
| 6,291,367 B1 | 9/2001 | Kelkar |
| 6,292,708 B1 | 9/2001 | Allen et al. |
| 6,298,274 B1 | 10/2001 | Inoue |
| 6,298,470 B1 | 10/2001 | Breiner et al. |
| 6,303,395 B1 | 10/2001 | Nulman |
| 6,304,999 B1 | 10/2001 | Toprac et al. |
| 6,307,628 B1 | 10/2001 | Lu et al. |
| 6,314,379 B1 | 11/2001 | Hu et al. |
| 6,317,643 B1 | 11/2001 | Dmochowski |
| 6,320,655 B1 | 11/2001 | Matsushita et al. |
| 6,324,481 B1 | 11/2001 | Atchison et al. |
| 6,334,807 B1 | 1/2002 | Lebel et al. |
| 6,336,841 B1 | 1/2002 | Chang |
| 6,339,727 B1 | 1/2002 | Ladd |
| 6,340,602 B1 | 1/2002 | Johnson et al. |
| 6,345,288 B1 | 2/2002 | Reed et al. |
| 6,345,315 B1 | 2/2002 | Mishra |
| 6,346,426 B1 | 2/2002 | Toprac et al. |
| 6,355,559 B1 | 3/2002 | Havemann et al. |
| 6,360,133 B1 | 3/2002 | Campbell et al. |
| 6,360,184 B1 | 3/2002 | Jacquez |
| 6,363,294 B1 | 3/2002 | Coronel et al. |
| 6,366,934 B1 | 4/2002 | Cheng et al. |
| 6,368,879 B1 | 4/2002 | Toprac |
| 6,368,883 B1 | 4/2002 | Bode et al. |
| 6,368,884 B1 | 4/2002 | Goodwin et al. |
| 6,379,980 B1 | 4/2002 | Toprac |
| 6,381,564 B1 | 4/2002 | Davis et al. |
| 6,388,253 B1 | 5/2002 | Su |
| 6,389,491 B1 | 5/2002 | Jacobson et al. |
| 6,391,780 B1 | 5/2002 | Shih et al. |
| 6,395,152 B1 | 5/2002 | Wang |
| 6,397,114 B1 | 5/2002 | Eryurek et al. |
| 6,400,162 B1 | 6/2002 | Mallory et al. |
| 6,405,096 B1 | 6/2002 | Toprac et al. |
| 6,405,144 B1 | 6/2002 | Toprac et al. |
| 6,417,014 B1 | 7/2002 | Lam et al. |
| 6,427,093 B1 | 7/2002 | Toprac |
| 6,432,728 B1 | 8/2002 | Tai et al. |
| 6,435,952 B1 | 8/2002 | Boyd et al. |
| 6,438,438 B1 | 8/2002 | Takagi et al. |
| 6,439,964 B1 | 8/2002 | Prahbu et al. |
| 6,440,295 B1 | 8/2002 | Wang |
| 6,442,496 B1 | 8/2002 | Pasadyn et al. |
| 6,449,524 B1 | 9/2002 | Miller et al. |
| 6,455,415 B1 | 9/2002 | Lopatin et al. |
| 6,455,937 B1 | 9/2002 | Cunningham |
| 6,465,263 B1 | 10/2002 | Coss, Jr. et al. |
| 6,469,518 B1 | 10/2002 | Davis et al. |
| 6,470,230 B1 | 10/2002 | Toprac et al. |
| 6,477,432 B1 | 11/2002 | Chen et al. |
| 6,479,902 B1 | 11/2002 | Lopatin et al. |
| 6,479,990 B2 | 11/2002 | Mednikov et al. |
| 6,482,660 B2 | 11/2002 | Conchieri et al. |
| 6,484,064 B1 | 11/2002 | Campbell |
| 6,486,492 B1 | 11/2002 | Su |
| 6,492,281 B1 | 12/2002 | Song et al. |
| 6,494,766 B1 * | 12/2002 | Wiswesser et al. ............... 451/6 |
| 6,495,452 B1 | 12/2002 | Shih |
| 6,503,839 B2 | 1/2003 | Gonzales et al. |
| 6,515,368 B1 | 2/2003 | Lopatin et al. |
| 6,517,413 B1 | 2/2003 | Hu et al. |
| 6,517,414 B1 | 2/2003 | Tobin et al. |
| 6,528,409 B1 | 3/2003 | Lopatin et al. |
| 6,529,789 B1 | 3/2003 | Campbell et al. |
| 6,532,555 B1 | 3/2003 | Miller et al. |
| 6,535,783 B1 | 3/2003 | Miller et al. |
| 6,537,912 B1 | 3/2003 | Agarwal |
| 6,540,591 B1 | 4/2003 | Pasadyn et al. |
| 6,541,401 B1 | 4/2003 | Herner et al. |
| 6,546,508 B1 | 4/2003 | Sonderman et al. |
| 6,556,881 B1 | 4/2003 | Miller |
| 6,560,504 B1 | 5/2003 | Goodwin et al. |
| 6,563,308 B2 | 5/2003 | Nagano et al. |
| 6,567,717 B2 | 5/2003 | Krivokapic et al. |
| 6,577,914 B1 | 6/2003 | Bode |
| 6,580,958 B1 | 6/2003 | Takano |
| 6,582,277 B2 * | 6/2003 | Korovin ........................... 451/5 |
| 6,587,744 B1 | 7/2003 | Stoddard et al. |
| 6,590,179 B2 | 7/2003 | Tanaka et al. |

| | | | | | | |
|---|---|---|---|---|---|---|
| 6,604,012 B1 | 8/2003 | Cho et al. | | EP | 0 881 040 A2 | 12/1998 |
| 6,605,549 B2 | 8/2003 | Leu et al. | | EP | 0 895 145 A1 | 2/1999 |
| 6,607,976 B2 | 8/2003 | Chen et al. | | EP | 0 910 123 | 4/1999 |
| 6,609,946 B1 | 8/2003 | Tran | | EP | 0 932 194 | 7/1999 |
| 6,616,513 B1 | 9/2003 | Osterheld | | EP | 0 932 195 A1 | 7/1999 |
| 6,618,692 B2 | 9/2003 | Takahashi et al. | | EP | 1 066 925 A2 | 1/2001 |
| 6,624,075 B1 | 9/2003 | Lopatin et al. | | EP | 1 067 757 | 1/2001 |
| 6,625,497 B2 | 9/2003 | Fairbairn et al. | | EP | 1 071 128 | 1/2001 |
| 6,630,741 B1 | 10/2003 | Lopatin et al. | | EP | 1 083 470 A2 | 3/2001 |
| 6,640,151 B1 | 10/2003 | Somekh et al. | | EP | 1 092 505 A2 | 4/2001 |
| 6,652,355 B2 | 11/2003 | Wiswesser et al. | | EP | 1072967 A3 | 11/2001 |
| 6,660,633 B1 | 12/2003 | Lopatin et al. | | EP | 1 182 526 A2 | 2/2002 |
| 6,669,782 B1 | 12/2003 | Thakur | | GB | 2 347 885 A | 9/2000 |
| 6,678,570 B1 | 1/2004 | Pasadyn et al. | | GB | 2 365 215 A | 2/2002 |
| 6,708,074 B1 | 3/2004 | Chi et al. | | JP | 61-66104 | 4/1986 |
| 6,708,075 B2 | 3/2004 | Sonderman et al. | | JP | 61-171147 | 8/1986 |
| 6,725,402 B1 | 4/2004 | Coss, Jr. et al. | | JP | 01-283934 | 11/1989 |
| 6,728,587 B2 | 4/2004 | Goldman et al. | | JP | 3-202710 | 9/1991 |
| 6,735,492 B2 | 5/2004 | Conrad et al. | | JP | 05-151231 | 6/1993 |
| 6,751,518 B1 | 6/2004 | Sonderman et al. | | JP | 05-5136098 | 7/1993 |
| 6,774,998 B1 | 8/2004 | Wright et al. | | JP | 05-5190457 | 7/1993 |
| 6,776,692 B1 | 8/2004 | Zuniga et al. | | JP | 05-216896 | 8/1993 |
| 6,913,938 B2 | 7/2005 | Shanmugasundram et al. | | JP | 05-266029 | 10/1993 |
| 6,988,017 B2 | 1/2006 | Pasadyn et al. | | JP | 06-110894 | 4/1994 |
| 7,018,275 B2 | 3/2006 | Zuniga et al. | | JP | 06-176994 | 6/1994 |
| 7,082,345 B2 | 7/2006 | Shanmugasundram et al. | | JP | 6-184434 | 7/1994 |
| 7,101,799 B2 | 9/2006 | Paik | | JP | 06-252236 | 9/1994 |
| 7,160,739 B2 | 1/2007 | Shanmugasundram et al. | | JP | 06-260380 | 9/1994 |
| 7,174,230 B2 | 2/2007 | Arackaparambil et al. | | JP | 8-23166 | 1/1996 |
| 7,201,936 B2 | 4/2007 | Schwarm et al. | | JP | 8-50161 | 2/1996 |
| 7,225,047 B2 | 5/2007 | Al-Bayati et al. | | JP | 08-149583 | 6/1996 |
| 2001/0001755 A1 | 5/2001 | Sandhu et al. | | JP | 8-304023 | 11/1996 |
| 2001/0003084 A1 | 6/2001 | Finarov | | JP | 09-34535 | 2/1997 |
| 2001/0006873 A1 | 7/2001 | Moore | | JP | 9-246547 | 9/1997 |
| 2001/0030366 A1 | 10/2001 | Nakano et al. | | JP | 09-269294 | 10/1997 |
| 2001/0039462 A1 | 11/2001 | Mendez et al. | | JP | 10-34522 | 2/1998 |
| 2001/0040997 A1 | 11/2001 | Tsap et al. | | JP | 10106984 * | 4/1998 |
| 2001/0042690 A1 | 11/2001 | Talieh | | JP | 10-173029 | 6/1998 |
| 2001/0044667 A1 | 11/2001 | Nakano et al. | | JP | 11-67853 | 3/1999 |
| 2002/0032499 A1 | 3/2002 | Wilson et al. | | JP | 11-126765 | 5/1999 |
| 2002/0058460 A1 | 5/2002 | Lee et al. | | JP | 11-126816 | 5/1999 |
| 2002/0070126 A1 | 6/2002 | Sato et al. | | JP | 11-135601 | 5/1999 |
| 2002/0077031 A1 | 6/2002 | Johansson et al. | | JP | 11-165256 | 6/1999 |
| 2002/0081951 A1 | 6/2002 | Boyd et al. | | JP | 2000-117623 | 4/2000 |
| 2002/0089676 A1 | 7/2002 | Pecen et al. | | JP | 2000-183001 | 6/2000 |
| 2002/0102853 A1 | 8/2002 | Li et al. | | JP | 2001-009699 | 1/2001 |
| 2002/0107599 A1 | 8/2002 | Patel et al. | | JP | 2001-60572 | 3/2001 |
| 2002/0107604 A1 | 8/2002 | Riley et al. | | JP | 2001-76982 | 3/2001 |
| 2002/0113039 A1 | 8/2002 | Mok et al. | | JP | 2001-160544 | 6/2001 |
| 2002/0127950 A1 | 9/2002 | Hirose et al. | | JP | 2001-284299 | 10/2001 |
| 2002/0128805 A1 | 9/2002 | Goldman et al. | | JP | 2001-305108 | 10/2001 |
| 2002/0149359 A1 | 10/2002 | Crouzen et al. | | JP | 2002-9030 | 1/2002 |
| 2002/0165636 A1 | 11/2002 | Hasan | | JP | 2002-343754 | 11/2002 |
| 2002/0183986 A1 | 12/2002 | Stewart et al. | | TW | 434103 | 5/2001 |
| 2002/0185658 A1 | 12/2002 | Inoue et al. | | TW | 436383 | 5/2001 |
| 2002/0192966 A1 | 12/2002 | Shanmugasundram et al. | | TW | 455938 | 9/2001 |
| 2002/0193899 A1 | 12/2002 | Shanmugasundram et al. | | TW | 455976 | 9/2001 |
| 2002/0193902 A1 | 12/2002 | Shanmugasundram et al. | | WO | WO 95/34866 | 12/1995 |
| 2002/0197745 A1 | 12/2002 | Shanmugasundram et al. | | WO | WO 98/05066 | 2/1998 |
| 2002/0197934 A1 | 12/2002 | Paik | | WO | WO 98/45090 | 10/1998 |
| 2002/0199082 A1 | 12/2002 | Shanmugasundram et al. | | WO | WO 99/09371 | 2/1999 |
| 2003/0017256 A1 | 1/2003 | Shimane | | WO | WO 99/25520 | 5/1999 |
| 2003/0020909 A1 | 1/2003 | Adams et al. | | WO | WO 99/59200 | 11/1999 |
| 2003/0020928 A1 | 1/2003 | Ritzdorf et al. | | WO | WO 00/00873 | 1/2000 |
| 2003/0154062 A1 | 8/2003 | Daft et al. | | WO | WO 00/00874 | 1/2000 |
| 2005/0221514 A1 | 10/2005 | Pasadyn et al. | | WO | WO 00/05759 | 2/2000 |
| 2007/0102116 A1* | 5/2007 | Shanmugasundram et al. ............ 156/345.13 | | WO | WO 00/35063 | 6/2000 |
| | | | | WO | WO 00/54325 | 9/2000 |
| 2007/0169694 A1 | 7/2007 | Schwarm et al. | | WO | WO 00/79355 A1 | 12/2000 |
| | | | | WO | WO 01/11679 | 2/2001 |
| FOREIGN PATENT DOCUMENTS | | | | WO | WO 01/15865 A1 | 3/2001 |
| CA | 2165847 | 8/1991 | | WO | WO 01/18623 | 3/2001 |
| CA | 2194855 | 8/1991 | | WO | WO 01/25865 | 4/2001 |
| EP | 0 397 924 A1 | 11/1990 | | WO | WO 01/33277 | 5/2001 |
| EP | 0 621 522 A2 | 10/1994 | | WO | WO 01/33501 A1 | 5/2001 |
| EP | 0 747 795 A2 | 12/1996 | | WO | WO 01/52055 A3 | 7/2001 |
| EP | 0 869 652 | 10/1998 | | WO | WO 01/52319 | 7/2001 |
| EP | 0869652 | 10/1998 | | WO | WO 01/57823 A2 | 8/2001 |
| EP | 0877308 A2 | 11/1998 | | WO | WO 01/80306 | 10/2001 |

| | | |
|---|---|---|
| WO | WO 02/17150 A1 | 2/2002 |
| WO | WO 02/31613 A2 | 4/2002 |
| WO | WO 02/31613 A3 | 4/2002 |
| WO | WO 02/33737 A2 | 4/2002 |
| WO | WO 02/074491 | 9/2002 |
| WO | WO 02/103778 | 12/2002 |

OTHER PUBLICATIONS

Notice of Allowance for U.S. Appl. No. 10/174,377, mailed Nov. 7, 2006. (P068).

Dishon, G., D. Eylon, M. Finarov, and A. Shulman. "Dielectric CMP Advances Process Control Based on Integrated Monitoring." Ltd. Rehoveth, Israel: Nova Measuring Instruments.

Runyan, W. R., and K. E. Bean. 1990. "Semiconductor Integrated Circuit Processing Technology." p. 48. Reading, Massachusetts: Addison-Wesley Publishing Company.

Zorich, Robert. 1991. *Handbook of Quality Integrated Circuit Manufacturing*. pp. 464-498 San Diego, California: Academic Press, Inc.

Rampalli, Prasad, Arakere Ramesh, and Nimish Shah. 1991. *CEPT—A Computer-Aided Manufacturing Application for Managing Equipment Reliability and Availability in the Semiconductor Industry*. New York, New York: IEEE.

Moyne, James R., Nauman Chaudhry, and Roland Telfeyan. 1995. "Adaptive Extensions to a Multi-Branch Run-to-Run Controller for Plasma Etching." *Journal of Vacuum Science and Technology*, Ann Arbor, Michigan: University of Michigan Display Technology Manufacturing Center.

Moyne, James, Roland Telfeyan, Arnon Hurwitz, and John Taylor. Aug. 1995. "A Process-Independent Run-to-Run Controller and Its Application to Chemical-Mechanical Planarization." *SEMI/IEEE Advanced Semiconductor Manufacturing Conference and Workshop*. Ann Arbor, Michigan: The University of Michigan, Electrical Engineering & Computer Science Center for Display Technology & Manufacturing.

U.S. Appl. No. 09/363,966, filed Jul. 29, 1999, Arackaparambil et al., Computer Integrated Manufacturing Techniques.

U.S. Appl. No. 09/469,227, filed Dec. 22, 1999, Somekh et al., Multi-Tool Control System, Method and Medium.

U.S. Appl. No. 09/619,044, filed Jul. 19, 2000, Yuan, System and Method of Exporting or Importing Object Data in a Manufacturing Execution System.

U.S. Appl. No. 09/637,620, filed Aug. 11, 2000, Chi et al., Generic Interface Builder.

U.S. Appl. No. 09/656,031, filed Sep. 6, 2000, Chi et al., Dispatching Component for Associating Manufacturing Facility Service Requestors with Service Providers.

Zhou, Zhen-Hong and Rafael Reif. Aug. 1995. "Epi-Film Thickness Measurements Using Emission Fourier Transform Infrared Spectroscopy—Part II: Real-Time in Situ Process Monitoring and Control " IEEE Transactions on Semiconductor Manufacturing, vol. 8, No. 3.

Telfeyan, Roland, James Moyne, Nauman Chaudhry, James Pugmire, Scott Shellman, Duane Boning, William Moyne, Arnon Hurwitz, and John Taylor. Oct. 1995. "A Multi-Level Approach to the Control of a Chemical-Mechanical Planarization Process." Minneapolis, Minnesota: $42^{nd}$ National Symposium of the American Vacuum Society.

Chang, E., B. Stine, T. Maung, R. Divecha, D. Boning, J. Chung, K. Chang, G. Ray, D. Bradbury, O. S. Nakagawa, S. Oh, and D. Bartelink. Dec. 1995. "Using a Statistical Metrology Framework to Identify Systematic and Random Sources of Die- and Wafer-level ILD Thickness Variation in CMP Processes." Washington, D.C.: International Electron Devices Meeting.

U.S. Appl. No. 09/655,542, filed Sep. 6, 2000, Yuan, System, Method and Medium for Defining Palettes to Transform an Application Program Interface for a Service.

U.S. Appl. No. 09/725,908, filed Nov. 30, 2000, Chi et al., Dynamic Subject Information Generation in Message Services of Distributed Object Systems.

U.S. Appl. No. 09/800,980, filed Mar. 8, 2001, Hawkins et al., Dynamic and Extensible Task Guide.

U.S. Appl. No. 09/811,667, filed Mar. 20, 2001, Yuan et al., Fault Tolerant and Automated Computer Software Workflow.

U.S. Appl. No. 09/927,444, filed Aug. 13, 2001, Ward et al., Dynamic Control of Wafer Processing Paths in Semiconductor Manufacturing Processes.

U.S. Appl. No. 09/928,473, filed Aug. 14, 2001, Koh, Tool Services Layer for Providing Tool Service Functions in Conjunction with Tool Functions.

Dishon, G., M. Finarov, R. Kipper, J.W. Curry, T. Schraub, D. Trojan, $4^{th}$ Stambaugh, Y. Li and J. Ben-Jacob. Feb. 1996. "On-Line Integrated Metrology for CMP Processing." Santa Clara, California: VMIC Speciality Conferences, $1^{st}$ International CMP Planarization Conference.

Smith, Taber, Duane Boning, James Moyne, Arnon Hurwitz, and John Curry. Jun. 1996. "Compensating for CMP Pad Wear Using Run by Run Feedback Control." Santa Clara, California: VLSI Multilevel Interconnect Conference.

Boning, Duane, William Moyne, Taber Smith, James Moyne, Roland Telfeyan, Arnon Hurwitz, Scott Shellman, and John Taylor. Oct. 1996. "Run by Run Control of Chemical-Mechanical Polishing." *IEEE Trans. CPMT (C)*, vol. 19, No. 4, pp. 307-314.

SEMI. [1986] 1996. "Standard for Definition and Measurement of Equipment Reliability, Availability, and Maintainability (RAM)." SEMI E10-96.

U.S. Appl. No. 09/928,474, filed Aug. 14, 2001, Krishnamurthy et al., Experiment Management System, Method and Medium.

Van Zant, Peter. 1997. *Microchip Fabrication: A Practical Guide to Semiconductor Processing*. Third Edition, pp. 472-478. New York, New York: McGraw-Hill.

Campbell, W. Jarrett, and Anthony J. Toprac. Feb. 11-12, 1998. "Run-to-Run Control in Microelectronics Manufacturing." Advanced Micro Devises, TWMCC.

Edgar, Thomas F., Stephanie W. Butler, Jarrett Campbell, Carlos Pfeiffer, Chris Bode, Sung Bo Hwang, and K.S. Balakrishnan. May 1998. "Automantic Control in Microelectronics Manufacturing: Practices, Challenges, and Possibilities." Automatica, vol. 36, pp. 1567-1603, 2000.

Moyne, James, and John Curry. Jun. 1998. "A Fully Automated Chemical-Mechanical Planarization Process." Santa Clara, California: VLSI Multilevel Interconnection (V-MIC) Conference.

SEMI. Jul. 1998. *New Standard: Provisional Specification for CIM Framework Domain Architecture*. Mountain View, California: SEMI Standards. SEMI Draft Doc. 2817.

Consilium. Aug. 1998. *Quality Management Component: QMC™ and QMC-Link™ Overview*. Mountain View, California: Consilium, Inc.

Chemali, Chadi El, James Moyne, Kareemullah Khan, Rock Nadeau, Paul Smith, John Colt, Jonathan Chapple-Sokol, and Tarun Parikh. Nov. 1998. "Multizone Uniformity Control of a CMP Process Utilizing a Pre and Post-Measurement Strategy." Seattle, Washington: SEMETECH Symposium.

Consilium. 1998. *FAB300™*. Mountain View, California: Consilium, Inc.

Khan, Kareemullah, Victor Solakhain, Anthony Ricci, Tier Gu, and James Moyne. 1998. "Run-to-Run Control of ITO Deposition Process." Ann Arbor, Michigan.

Consilium. Jan. 1999. "FAB300™: Consilium's Next Generation MES Solution of Software and Services which Control and Automate Real-Time FAB Operations." www.consilium.com/products/fab300_page.htm#FAB300 Introduction.

Consilium. Jul. 1999. "Increasing Overall Equipment Effectiveness (OEE) in Fab Manufacturing by Implementing Consilium's Next-Generation Manufacturing Execution System—MES II." Semiconductor Fabtech Edition 10.

Consilium Corporate Brochure. Oct. 1999. www.consilium.com.

Moyne, James. Oct. 1999. "Advancements in CMP Process Automation and Control." Hawaii: (Invited paper and presentation to) Third International Symposium on Chemical Mechanical Polishing in IC Device Manufacturing: $196^{th}$ Meeting of the Electrochemical Society.

Consilium. Nov. 1999. *FAB300™ Update*.

SEMI. 2000. "Provisional Specification for CIM Framework Scheduling Component." San Jose, California. SEMI E105-1000.

Lee, Brian, Duane S. Boning, Winthrop Baylies, Noel Poduje, Pat Hester, Yong Xia, John Valley, Chris Koliopoulus, Dale Hetherington, HongJiang Sun, and Michael Lacy. Apr. 2001. "Wafer Nanotopography Effects on CMP: Experimental Validation of Modeling Methods." San Francisco, California: Materials Research Society Spring Meeting.

NovaScan 2020. Feb. 2002. "Superior Integrated Process Control for Emerging CMP High-End Applications."

Feb. 1984. "Method and Apparatus of in Situ Measurement and Overlay Error Analysis for Correcting Step and Repeat Lithographic Cameras." *IBM Technical Disclosure Bulletin*, pp. 4855-4859.

Oct. 1984. "Method to Characterize the Stability of a Step and Repeat Lithographic System." *IBM Technical Disclosure Bulletin*, pp. 2857-2860.

Schmid, Hans Albrecht. 1995. "Creating the Architecture of a Manufacturing Framework by Design Patterns." Austin, Texas: OOPSLA.

Baliga, John. Jul. 1999. "Advanced Process Control: Soon to be a Must." Cahners Semiconductor International. www.semiconductor.net/semiconductor/issues/issues/1999/jul99/docs/feature1.asp.

Jul. 5, 2001. "Motorola and Advanced Micro Devices Buy ObjectSpace Catalyst Advanced Process Control Product for Five Wafer Fabs." Semiconductor FABTECH. www.semiconductorfabtech.com/industry.news/9907/20.07.shtml.

Oct. 15, 2001. Search Report prepared by the Austrian Patent Office for Singapore Patent Application No. 200004286-1.

Johnson, Bob. Jun. 10, 2002. "Advanced Process Control Key to Moore's Law." Gartner, Inc.

Jul. 9, 2002. International Search Report prepared by the European Patent Office for PCT/US01/24910.

Jul. 29, 2002. International Search Report prepared by the European Patent Office for PCT/US01/27407.

Sonderman, Thomas. 2002. "APC as a Competitive Manufacturing Technology: *AMD's Vision for 300mm*." AEC/APC.

Jul. 23, 2002. Communication Pursuant to Article 96(2) EPC for European Patent Application No. 00 115 577.9.

Oct. 15, 2002. International Search Report prepared by the European Patent Office for PCT/US02/19062.

Hu, Albert, Kevin Nguyen, Steve Wong, Xiuhua Zhang, Emanuel Sachs, and Peter Renteln. 1993. "Concurrent Deployment of Run by Run Controller Using SCC Framework." IEEE/SEMI International Semiconductor Manufacturing Science Symposium. pp. 126-132.

Hu, Albert, He Du, Steve Wong, Peter Renteln, and Emanuel Sachs. 1994. "Application of Run by Run Controller to the Chemical-Mechanical Planarization Process." IEEE/CPMT International Electronics Manufacturing Technology Symposium. pp. 371-378.

Smith, Taber, Duane Boning, James Moyne, Arnon Hurwitz, and John Curry. Jun. 1996. "Compensating for CMP Pad Wear Using Run by Run Feedback Control." Proceedings of the Thirteenth International VLSI Multilevel Interconnection Conference. pp. 437-439.

Suzuki, Junichi and Yoshikazu Yamamoto. 1998. "Toward the Interoperable Software Design Models: Quartet of UML, XML, DOM and CORBA." Proceedings IEEE International Software Engineering Standards Symposium. pp. 1-10.

Klein, Bruce. Jun. 1999. "Application Development: XML Makes Object Models More Useful." Informationweek. pp. 1A-6A.

Chemali, Chadi El, James Moyne, Kareemullah Khan, Rock Nadeau, Paul Smith, John Colt, Jonathan Chapple-Sokol, and Tarun Parikh. Jul./Aug. 2000. "Multizone Uniformity Control of a Chemical Mechanical Polishing Process Utilizing a Pre- and Postmeasurement Strategy." J. Vac. Sci. Technol. A, vol. 18(4). pp. 1287-1296. American Vacuum Society.

Jensen, Alan, Peter Renteln, Stephen Jew, Chris Raeder, and Patrick Cheung. Jun. 2001. "Empirical-Based Modeling for Control of CMP Removal Uniformity." Solid State Technology, vol. 44, No. 6, pp. 101-102, 104, 106. Cowan Publ. Corp.: Washington, D.C.

Sarfaty, Moshe, Arulkumar Shanmugasundram, Alexander Schwarm, Joseph Paik, Jimin Zhang, Rong Pan, Martin J. Seamons, Howard Li, Raymond Hung, and Suketu Parikh. Apr./May 2002. "Advance Process Control Solutions for Semiconductor Manufacturing." IEEE/SEMI Advanced Semiconductor Manufacturing Conference. pp. 101-106.

Oct. 4, 2002. International Search Report from PCT/US01/22833.

Oct. 23, 2002. International Search Report from PCT/US01/27406.

Nov. 7, 2002. International Search Report from PCT/US02/19061.

Nov. 11, 2002. International Search Report from PCT/US02/19117.

Nov. 12, 2002. International Search Report from PCT/US02/19063.

Ostanin, Yu.Ya. Oct. 1981. "Optimization of Thickness Inspection of Electrically Conductive Single-Layer Coatings with Laid-on Eddy-Current Transducers (Abstract)." *Defektoskopiya*, vol. 17, No. 10, pp. 45-52. Moscow, USSR.

Feb. 1984. "Substrate Screening Process." *IBM Technical Disclosure Bulletin*, pp. 4824-4825.

Herrmann, D. 1988. "Temperature Errors and Ways of Elimination for Contactless Measurement of Shaft Vibrations (Abstract)." *Technisches Messen™*, vol. 55, No. 1, pp. 27-30. West Germany.

Lin, Kuang-Kuo and Costas J. Spanos. Nov. 1990. "Statistical Equipment Modeling for VLSI Manufacturing: An Application for LPCVD." *IEEE Transactions on Semiconductor Manufacturing*, v. 3, n. 4, pp. 216-229.

Chang, Norman H. and Costas J. Spanos. Feb. 1991. "Continuous Equipment Diagnosis Using Evidence Integration: An LPCVD Application." *IEEE Transactions on Semiconductor Manufacturing*, v. 4, n. 1, pp. 43-51.

Larrabee, G. B. May 1991. "The Intelligent Microelectronics Factory of the Future (Abstract)." *IEEE/SEMI International Semiconductor Manufacturing Science Symposium*, pp. 30-34. Burlingame, CA.

Burke, Peter A. Jun. 1991. "Semi-Empirical Modelling of SiO2 Chemical-Mechanical Polishing Planarization." *VMIC Conference, 1991 IEEE*, pp. 379-384. IEEE.

May 1992. "Laser Ablation Endpoint Detector." *IBM Technical Disclosure Bulletin*, pp. 333-334.

Spanos, Costas J., Hai-Fang Guo, Alan Miller, and Joanne Levine-Parrill. Nov. 1992. "Real-Time Statistical Process Control Using Tool Data." *IEEE Transactions on Semiconductor Manufacturing*, v. 5, n. 4, pp. 308-318.

Feb. 1993. "Electroless Plating Scheme to Hermetically Seal Copper Features." *IBM Technical Disclosure Bulletin*, pp. 405-406.

Scarr, J. M. and J. K. Zelisse. Apr. 1993. "New Topology for Thickness Monitoring Eddy Current Sensors (Abstract)." *Proceedings of the 36th Annual Technical Conference*, Dallas, Texas.

Matsuyama, Akira and Jessi Niou. 1993. "A State-of-the-Art Automation System of an ASIC Wafer Fab in Japan." *IEEE/SEMI International Semiconductor Manufacturing Science Syposium*, pp. 42-47.

Yeh, C. Eugene, John C. Cheng, and Kwan Wong. 1993. "Implementation Challenges of a Feedback Control System for Wafer Fabrication." *IEEE/CHMT International Electronics Manufacturing Technology Symposium*, pp. 438-442.

Kurtzberg, Jerome M. and Menachem Levanoni. Jan. 1994. "ABC: A Better Control for Manufacturing." *IBM Journal of Research and Development*, v. 38, n. 1, pp. 11-30.

Mozumder, Purnendu K. and Gabriel G. Barna. Feb. 1994. "Statistical Feedback Control of a Plasma Etch Process." *IEEE Transactions on Semiconductor Manufacturing*, v. 7, n. 1, pp. 1-11.

Muller-Heinzerling, Thomas, Ulrich Neu, Hans Georg Nurnberg, and Wolfgang May. Mar. 1994. "Recipe-Controlled Operation of Batch Processes with Batch X." *ATP Automatisierungstechnische Praxis*, vol. 36, No. 3, pp. 43-51.

Stoddard, K., P. Crouch, M. Kozicki, and K. Tsakalis. Jun.-Jul. 1994. "Application of Feedforward and Adaptive Feedback Control to Semiconductor Device Manufacturing (Abstract)." *Proceedings of 1994 American Control Conference—ACC '94*, vol. 1, pp. 892-896. Baltimore, Maryland.

Schaper, C. D., M. M. Moslehi, K. C. Saraswat, and T. Kailath. Nov. 1994. "Modeling, Identification, and Control of Rapid Thermal Processing Systems (Abstract)." *Journal of the Electrochemical Society*, vol. 141, No. 11, pp. 3200-3209.

Tao, K. M., R. L. Kosut, M. Ekblad, and G. Aral. Dec. 1994. "Feedforward Learning Applied to RTP of Semiconductor Wafers (Abstract)." *Proceedings of the 33rd IEEE Conference on Decision and Control*, vol. 1, pp. 67-72. Lake Buena Vista, Florida.

Hu, Albert, He Du, Steve Wong, Peter Renteln, and Emmanuel Sachs. 1994. "Application of Run by Run Controller to the Chemical-Mechanical Planarization Process." *IEEE/CPMT International Electronics Manufacturing Technology Symposium*, pp. 371-378.

Spanos, C. J., S. Leang, S.-Y. Ma, J. Thomson, B. Bombay, and X. Niu. May 1995. "A Multistep Supervisory Controller for Photolithographic Operations (Abstract)." *Proceedings of the Symposium on Process Control, Diagnostics, and Modeling in Semiconductor Manufacturing*, pp. 3-17.

Leang, Sovarong, Shang-Yi Ma, John Thomson, Batt John Bombay, and Costas J. Spanos. May 1996. "A Control System for Photolithographic Sequences." *IEEE Transactions on Semiconductor Manufacturing*, vol. 9, No. 2.

Boning, Duane S., William P. Moyne, Taber H. Smith, James Moyne, Ronald Telfeyan, Anion Hurwitz, Scott Shellman, and John Taylor. Oct. 1996. "Run by Run Control of Chemical-Mechanical Polishing." *IEEE Transactions on Components, Packaging, and Manufacturing Technology—Part C*, vol. 19, No. 4, pp. 307-314.

Zhe, Ning, J. R. Moyne, T. Smith, D. Boning, E. Del Castillo, Yeh Jinn-Yi, and Hurwitz. Nov. 1996. "A Comparative Analysis of Run-to-Run Control Algorithms in Semiconductor Manufacturing Industry (Abstract)." *IEEE/SEMI 1996 Advanced Semiconductor Manufacturing Conference Workshop*, pp. 375-381.

Yasuda, M., T. Osaka, and M. Ikeda. Dec. 1996. "Feedforward Control of a Vibration Isolation System for Disturbance Suppression (Abstract)." *Proceeding of the 35th IEEE Conference on Decision and Control*, vol. 2, pp. 1229-1233. Kobe, Japan.

Fan, Jr-Min, Ruey-Shan Guo, Shi-Chung Chang, and Kian-Huei Lee. 1996. "Abnormal Tred Detection of Sequence-Disordered Data Using EWMA Method." *IEEE/SEMI Advanced Semiconductor Manufacturing Conference*, pp. 169-174.

Smith, Taber and Duane Boning. 1996. "A Self-Tuning EWMA Controller Utilizing Artificial Neural Network Function Approximation Techniques." *IEEE/CPMT International Electronics Manufacturing Technology Symposium*, pp. 355-363.

Guo, Ruey-Shan, Li-Shia Huang, Argon Chen, and Jin-Jung Chen. Oct. 1997. "A Cost-Effective Methodology for a Run-by-Run EWMA Controller." *6th International Symposium on Semiconductor Manufacturing*, pp. 61-64.

Mullins, J. A., W. J. Campbell, and A. D. Stock. Oct. 1997. "An Evaluation of Model Predictive Control in Run-to-Run Processing in Semiconductor Manufacturing (Abstract)." *Proceedings of the SPIE—The International Society for Optical Engineering Conference*, vol. 3213, pp. 182-189.

Reitman, E. A., D. J. Friedman, and E. R. Lory. Nov. 1997. "Pre-Production Results Demonstrating Multiple-System Models for Yield Analysis (Abstract)." *IEEE Transactions on Semiconductor Manufacturing*, vol. 10, No. 4, pp. 469-481.

Durham, Jim and Myriam Roussel. 1997. "A Statistical Method for Correlating In-Line Defectivity to Probe Yield." *IEEE/SEMI Advanced Semiconductor Manufacturing Conference*, pp. 76-77.

Shindo, Wataru, Eric H. Wang, Ram Akella, and Andrzej J. Strojwas. 1997. "Excursion Detection and Source Isolation in Defect Inspection and Classification." *2nd International Workshop on Statistical Metrology*, pp. 90-93.

Jul. 1998. "Active Controller: Utilizing Active Databases for Implementing Multistep Control of Semiconductor Manufacturing (Abstract)." *IEEE Transactions on Components, Packaging and Manufacturing Technology—Part C*, vol. 21, No. 3, pp. 217-224.

Fang, S. J., A. Bards, T. Janecko, W. Little, D. Outley, G. Hempel, S. Joshi, B. Morrison, G. B. Shinn, and M. Birang. 1998. "Control of Dielectric Chemical Mechanical Polishing (CMP) Using and Interferometry Based Endpoint Sensor." *International Proceedings of the IEEE Interconnect Technology Conference*, pp. 76-78.

Ouma, Dennis, Duane Boning, James Chung, Greg Shinn, Leif Olsen, and John Clark. 1998. "An Integrated Characterization and Modeling Methodology for CMP Dielectric Planarization." *Proceedings of the IEEE 1998 International Interconnect Technology Conference*, pp. 67-69.

Boning, Duane S., Jerry Stefani, and Stephanie W. Butler. Feb. 1999. "Statistical Methods for Semiconductor Manufacturing." *Encyclopedia of Electrical Engineering, J. G. Webster, Ed*.

McIntosh, John. Mar. 1999. "Using CD-SEM Metrology in the Manufacture of Semiconductors (Abstract)." *JOM*, vol. 51, No. 3, pp. 38-39.

Pan, J. Tony, Ping Li, Kapila Wijekoon, Stan Tsai, and Fritz Redeker. May 1999. "Copper CMP Integration and Time Dependent Pattern Effect." *IEEE 1999 International Interconnect Technology Conference*, pp. 164-166.

Meckl, P. H. and K. Umemoto. Aug. 1999. "Achieving Fast Motions in Semiconductor Manufacturing Machinery (Abstract)." *Proceedings of the 1999 IEEE International Conference on Control Applications*, vol. 1, pp. 725-729. Kohala Coast, HI.

Khan, K., C. El Chemali, J. Moyne, J. Chapple-Sokol, R. Nadeau, P. Smith, C., and T. Parikh. Oct. 1999. "Yield Improvement at the Contact Process Through Run-to-Run Control (Abstract)." *24th IEEE/CPMT Electronics Manufacturing Technology Symposium*, pp. 258-263.

Ruegsegger, Steven, Aaron Wagner, James S. Freudenberg, and Dennis S. Grimard. Nov. 1999. "Feedforward Control for Reduced Run-to-Run Variation in Microelectronics Manufacturing." *IEEE Transactions on Semiconductor Manufacturing*, vol. 12, No. 4.

Nov. 1999. "How to Use EWMA to Achieve SPC and EPC Control." *International Symposium on NDT Contribution to the Infrastructure Safety Systems*, Tores, Brazil. <http://www.ndt.net/abstract/ndtiss99/data/35.htm>.

Edgar, T. F., W. J. Campbell, and C. Bode. Dec. 1999. "Model-Based Control in Microelectronics Manufacturing." *Proceedings of the 38th IEEE Conference on Decision and Control*, Phoenix, Arizona, vol. 4, pp. 4185-4191.

Meckl, P. H. and K. Umemoto. Apr. 2000. "Achieving Fast Motions by Using Shaped Reference Inputs [Semiconductor Manufacturing Machine] (Abstract)." *NEC Research and Development*, vol. 41, No. 2, pp. 232-237.

Oechsner, R., T. Tschaftary, S. Sommer, L. Pfitzner, H. Ryssel, H. Gerath, C. Baier, and M. Hafner. Sep. 2000. "Feed-forward Control for a Lithography/Etch Sequence (Abstract)." *Proceedings of the SPIE—The International Society for Optical Engineering Conference*, vol. 4182, pp. 31-39.

Cheung, Robin. Oct. 18, 2000. "Copper Interconnect Technology." *AVS/CMP User Group Meeting*, Santa Clara, CA.

Edgar, Thomas F., Stephanie W. Butler, W. Jarrett Campbell, Carlos Pfeiffer, Christopher Bode, Sung Bo Hwang, K. S. Balakrishnan, and J. Hahn. Nov. 2000. "Automatic Control in Microelectronics Manufacturing: Practices, Challenges, and Possibilities (Abstract)." *Automatica*, v. 36, n. 11.

Khan, S., M. Musavi, and H. Ressom. Nov. 2000. "Critical Dimension Control in Semiconductor Manufacturing (Abstract)." *ANNIE 2000. Smart Engineering Systems Design Conference*, pp. 995-1000. St. Louis, Missouri.

ACM Research Inc. 2000. "Advanced Copper Metallization for 0.13 to 0.05 μm & Beyond." <http://acmrc.com/press/ACM-ECP-brochure.pdf>.

Ravid, Avi, Avner Sharon, Amit Weingarten, Vladimir Machavariani, and David Scheiner. 2000. "Copper CMP Planarity Control Using ITM." *IEEE/SEMI Advanced Semiconductor Manufacturing Conference*, pp. 437-443.

Chen, Argon and Ruey-Shan Guo. Feb. 2001. "Age-Based Double EWMA Controller and Its Application to CMP Processes." *IEEE Transactions on Semiconductor Manufacturing*, vol. 14, No. 1, pp. 11-19.

Tobin, K. W., T. P. Karnowski, L. F. Arrowood, and F. Lakhani. Apr. 2001. "Field Test Results of an Automated Image Retrieval System (Abstract)." *Advanced Semiconductor Manufacturing Conference, 2001 IEEE/SEMI*, Munich, Germany.

Tan, K. K., H. F. Dou, and K. Z. Tang. May-Jun. 2001. "Precision Motion Control System for Ultra-Precision Semiconductor and Electronic Components Manufacturing (Abstract)." *51st Electronic Components and Technology Conference 2001. Proceedings*, pp. 1372-1379. Orlando, Florida.

Heuberger, U. Sep. 2001. "Coating Thickness Measurement with Dual-Function Eddy-Current & Magnetic Inductance Instrument (Abstract)." *Galvanotechnik*, vol. 92, No. 9, pp. 2354-2366+IV.

Wang, LiRen and Hefin Rowlands. 2001. "A Novel NN-Fuzzy-SPC Feedback Control System." *8th IEEE International Conference on Emerging Technologies and Factory Automation*, pp. 417-423.

Moyne, J., V. Solakhian, A. Yershov, M. Anderson, and D. Mockler-Hebert. Apr.-May 2002. "Development and Deployment of a Multi-Component Advanced Process Control System for an Epitaxy Tool (Abstract)." *2002 IEEE Advanced Semiconductor Manufacturing Conference and Workshop*, pp. 125-130.

Sarfaty, M., A. Shanmugasundram, A. Schwarm, J. Paik, Jimin Zhang, Rong Pan, M. J. Seamons, H. Li, R. Hung, and S. Parikh. Apr.-May 2002. "Advance Process Control Solutions for Semiconductor Manufacturing (Abstract)." *13th Annual IEEE/SEMI Advanced Semiconductor Manufacturing Conference. Advancing the Science and Technology of Semiconductor Manufacturing. ASMC 2002*, pp. 101-106. Boston, MA.

Campbell, W. J., S. K. Firth, A. J. Toprac, and T. F. Edgar. May 2002. "A Comparison of Run-to-Run Control Algorithm (Abstract)." *Proceedings of 2002 American Control Conference*, vol. 3, pp. 2150-2155.

Good, Richard and S. Joe Qin. May 2002. "Stability Analysis of Double EWMA Run-to-Run Control with Metrology Delay." *IEEE/CPMT International Electronics Manufacturing Technology Symposium*, pp. 355-363.

Smith, Stewart, Anthony J. Walton, Alan W. S. Ross, Georg K. H. Bodammer, and J. T. M. Stevenson. May 2002. "Evaluation of Sheet Resistance and Electrical Linewidth Measurement Techniques for Copper Damascene Interconnect." *IEEE Transactions on Semiconductor Manufacturing*, vol. 15, No. 2, pp. 214-222.

Itabashi, Takeyuki, Hiroshi Nakano, and Haruo Akahoshi. Jun. 2002. "Electroless Deposited CoWB for Copper Diffusion Barrier Metal." *IEEE International Interconnect Technology Conference*, pp. 285-287.

ACM Research, Inc. 2002. "ACM Ultra ECP® System: Electro-Copper Plating (ECP) Deposition." www.acmrc.com/ecp.html.

Applied Materials, Inc. 2002. "Applied Materials: Information for Everyone: Copper Electrochemical Plating." www.appliedmaterials.com/products/copper_electrochemical_plating.html.

KLA-Tencor Corporation. 2002. "KLA Tencor: Press Release: KLA-Tencor Introduces First Production-Worthy Copper CMP In-Situ Film Thickness and End-point Control System: Multi-Million Dollar Order Shipped to Major CMP Tool Manufacturer." www.kla-tencor.com/news_events/press_releases/press_releases2001/984086002.html.

Takahashi, Shingo, Kaori Tai, Hiizu Ohtorii, Naoki Komai, Yuji Segawa, Hiroshi Horikoshi, Zenya Yasuda, Hiroshi Yamada, Masao Ishihara, and Takeshi Nogami. 2002. "Fragile Porous Low-k/Copper Integration by Using Electro-Chemical Polishing." *2002 Symposium on VLSI Technology Digest of Technical Papers*, pp. 32-33.

Cunningham, James A. 2003. "Using Electrochemistry to Improve Copper Interconnects." <http://www.e-insite.net/semiconductor/index.asp?layout=article&articleid=CA47465>.

Mar. 25, 2003. International Search Report for PCT/US02/24859 prepared by the European Patent Office.

Adams, Bret W., Bogdan Swedek, Rajeev Bajaj, Fritz Redeker, Manush Birang, and Gregory Amico. "Full-Wafer Endpoint Detection Improves Process Control in Copper CMP." *Semiconductor Fabtech*—12th Edition. Applied Materials, Inc., Santa Clara, CA.

Berman, Mike, Thomas Bibby, and Alan Smith. "Review of In Situ & In-line Detection for CMP Applications." *Semiconductor Fabtech*, 8th Edition, pp. 267-274.

"Semiconductor Manufacturing: An Overview." <http://users.ece.gatech.edu/~gmay/overview.html>.

Levine, Martin D. 1985. *Vision in Man and Machine*. New York: McGraw-Hill, Inc. pp. ix-xii, 1-58.

Pilu, Maurizio. Sep. 2001. "Undoing Page Curl Distortion Using Applicable Surfaces." *IEEE International Conference on Image Processing*. Thessalonica, Greece.

May 23, 2003. Written Opinion for PCT/US01/24910.

Williams, Randy, Dadi Gudmundsson, Kevin Monahan, Raman Nurani, Meryl Stoller and J. George Shanthikumar. Oct. 1999. "Optimized Sample Planning for Wafer Defect Inspection," *Semiconductor Manufacturing Conference Proceedings, 1999 IEEE International Symposium on Santa Clara, CA*. Piscataway, NJ. pp. 43-46.

Jul. 23, 2003. Invitation to Pay Additional Fees and Communication Relating to the Results of the Partial International Search for PCT/US02/19116.

Aug. 1, 2003. Written Opinion for PCT/US01/27406.

Aug. 20, 2003. Written Opinion for PCT/US01/22833.

Rocha, Joao and Carlos Ramos. Sep. 12, 1994. "Task Planning for Flexible and Agile Manufacturing Systems." *Intelligent Robots and Systems '94. Advanced Robotic Systems and the Real World, IROS '94. Proceedings of the IEEE/RSJ/GI International Conference on Munich, Germany Sep. 12-16, 1994*. New York, New York: IEEE. pp. 105-112.

Mar. 15, 2002. Office Action for U.S. Appl. No. 09/469,227, filed Dec. 22, 1999.

Mar. 29, 2002. Office Action for U.S. Appl. No. 09/363,966, filed Jul. 29, 1999.

Jun. 20, 2002. Office Action for U.S. Appl. No. 09/619,044, filed Jul. 19, 2000.

Sep. 26, 2002. Office Action for U.S. Appl. No. 09/637,620, filed Aug. 11, 2000.

Oct. 23, 2002. Office Action for U.S. Appl. No. 09/469,227, filed Dec. 22, 1999.

Dec. 17, 2002. Office Action for U.S. Appl. No. 09/363,966, filed Jul. 29, 1999.

Feb. 10, 2003. Office Action for U.S. Appl. No. 09/619,044, filed Jul. 19, 2000.

Apr. 9, 2003. Office Action for U.S. Appl. No. 09/928,474, filed Aug. 14, 2001.

May 8, 2003. Office Action for U.S. Appl. No. 09/637,620, filed Aug. 11, 2000.

Jun. 18, 2003. Office Action for U.S. Appl. No. 09/655,542, filed Sep. 6, 2000.

Aug. 8, 2003. International Search Report for PCT/US03/08513.

Aug. 25, 2003. Office Action for U.S. Appl. No. 10/100,184, filed Mar. 19, 2002.

Sep. 15, 2003. Office Action for U.S. Appl. No. 09/928,474, filed Aug. 14, 2001.

Nov. 5, 2003. Office Action for U.S. Appl. No. 10/172,977, filed Jun. 18, 2002.

Dec. 1, 2003. Office Action for U.S. Appl. No. 10/173,108, filed Jun. 18, 2002.

Dec. 11, 2003. Office Action for U.S. Appl. No. 09/943,383, filed Aug. 31, 2001.

Dec. 16, 2003. International Search Report for PCT/US03/23964.

Jan. 20, 2004. Office Action for U.S. Appl. No. 09/927,444, filed Aug. 13, 2001.

Jan. 23, 2004. International Search Report for PCT/US02/24860.

Feb. 2, 2004. Office Action for U.S. Appl. No. 09/363,966, filed Jul. 29, 1999.

Miller, G. L., D. A. H. Robinson, and J. D. Wiley. Jul. 1976. "Contactless measurement of semiconductor conductivity by radio frequency-free-carrier power absorption." *Rev. Sci. Instrum.*, vol. 47, No. 7. pp. 799-805.

1999. "Contactless Bulk Resistivity/Sheet Resistance Measurement and Mapping Systems." www.Lehighton.com/fabtech1/index.html.

2000. "Microsense II Capacitance Gaging System." www.adetech.com.

El Chemali, Chadi et al. Jul./Aug. 2000. "Multizone uniformity control of a chemical mechanical polishing process utilizing a pre- and postmeasurement strategy." *J. Vac. Sci. Technol*. vol. 18, No. 4. pp. 1287-1296.

Mar. 5, 2001. "KLA-Tencor Introduces First Production-worthy Copper CMP In-situ Film Thickness and End-point Control System." http://www.kla-tencor.com/j/servlet/NewsItem?newsItemID=74.

2002. "Microsense II—5810: Non-Contact Capacitance Gaging Module." www.adetech.com.

Aug. 8, 2003. PCT International Search Report from PCT/US03/08513.

Oct. 14, 2003. PCT International Search Report from PCT/US02/21942.

Oct. 20, 2003. PCT International Search Report from PCT/US02/19116.

Oct. 23, 2003. PCT International Preliminary Examination Report from PCT/US01/24910.

"NanoMapper wafer nanotopography measurement by ADE Phase Shift." http://www.phase-shift.com/nanomap.shtml.

"Wafer flatness measurement of advanced wafers." http://www.phase-shift.com/wafer-flatness.shtml.

"ADE Technologies, Inc.—6360." http://www.adetech.com/6360.shtml.

"3D optical profilometer MicroXAM by ADE Phase Shift." http://www.phase-shift.com/microxam.shtml.

"NanoMapper FA factory automation wafer nanotopography measurement." http://www.phase-shift.com/nanomapperfa.shtml.

Sun, S.C. 1998. "CVD and PVD Transition Metal Nitrides as Diffusion Barriers for Cu Metallization." *IEEE*. pp. 243-246.

Tagami, M., A. Furuya, T. Onodera, and Y. Hayashi. 1999. "Layered Ta-nitrides (LTN) Barrier Film by Power Swing Sputtering (PSS) Technique for MOCVD-Cu Damascene Interconnects." *IEEE*. pp. 635-638.

Yamagishi, H., Z. Tokei, G.P. Beyer, R. Donaton, H. Bender, T. Nogami, and K. Maex. 2000. "TEM/SEM Investigation and Electrical Evaluation of a Bottomless I-PVD TA(N) Barrier in Dual Damascene" (Abstract). *Advanced Metallization Conference 2000*. San Diego, CA.

Eisenbraun, Eric, Oscar van der Straten, Yu Zhu, Katharine Dovidenko, and Alain Kaloyeros. 2001. "Atomic Layer Deposition (ALD) of Tantalum-Based Materials for Zero Thickness Copper Barrier Applications" (Abstract). *IEEE*. pp. 207-209.

Smith, S.R., K.E. Elers, T. Jacobs, V. Blaschke, and K. Pfeifer. 2001. "Physical and Electrical Characterization of ALD Tin Used as a Copper Diffusion Barrier in 0.25 mum, Dual Damascene Backend Structures" (Abstract). *Advanced Metallization Conference 2001*. Montreal, Quebec.

Kim, Y.T. and H. Sim. 2002. "Characteristics of Pulse Plasma Enhanced Atomic Layer Deposition of Tungsten Nitride Diffusion Barrier for Copper Interconnect" (Abstract). *IEIC Technical Report*. vol. 102, No. 178, pp. 115-118.

Elers, Kai-Erik, Ville Saanila, Pekka J. Soininen, Wei-Min Li, Juliana T. Kostamo, Suvi Haukka, Jyrki Juhanoja, and Wim F.A. Besling. 2002. "Diffusion Barrier Deposition on a Copper Surface by Atomic Layer Deposition" (Abstract). *Advanced Materials*. vol. 14, No. 13-14, pp. 149-153.

Peng, C.H., C.H. Hsieh, C.L. Huang, J.C. Lin, M.H. Tsai, M.W. Lin, C.L. Chang, Winston S. Shue, and M.S. Liang. 2002. "A 90nm Generation Copper Dual Damascene Technology with ALD TaN Barrier." *IEEE*. pp. 603-606.

Van der Straten, O., Y. Zhu, E. Eisenbraun, and A. Kaloyeros. 2002. "Thermal and Electridal Barrier Performance Testing of Ultrathin Atomic Layer Deposition Tantalum-Based Materials for Nanoscale Copper Metallization." *IEEE*. pp. 188-190.

Wu, Z.C., Y.C. Lu, C.C. Chiang, M.C. Chen, B.T. Chen, G.J. Wang, Y.T. Chen, J.L. Huang, S.M. Jang, and M.S. Liang. 2002. "Advanced Metal Barrier Free Cu Damascene Interconnects with PECVD Silicon Carbide Barriers for 90/65-nm BEOL Technology." *IEEE*. pp. 595-598.

Jul. 25, 2003. International Search Report for PCT/US02/24858.

Mar. 30, 2004. Written Opinion for PCT/US02/19062.

Apr. 9, 2004. Written Opinion for PCT/US02/19116.

Apr. 22, 2004. Office Action for U.S. Appl. No. 09/998,372, filed Nov. 30, 2001.

Apr. 28, 2004. Written Opinion for PCT/US02/19117.

Apr. 29, 2004. Written Opinion for PCT/US02/19061.

May 5, 2004. International Preliminary Examination Report for PCT/US01/27406.

May 28, 2004. Office Action for U.S. Appl. No. 09/943,383, filed Aug. 31, 2001.

Jun. 3, 2004. Office Action for U.S. Appl. No. 09/928,474, filed Aug. 14, 2001.

Jun. 23, 2004. Office Action for U.S. Appl. No. 10/686,589, filed Oct. 17, 2003.

Jun. 30, 2004. Office Action for U.S. Appl. No. 09/800,980, filed Mar. 8, 2001.

Jul. 12, 2004. Office Action for U.S. Appl. No. 10/173,108, filed Jun. 8, 2002.

Sep. 15, 2004. Office Action for U.S. Appl. No. 10/632,107, filed Aug. 1, 2003.

Sep. 29, 2004. Office Action for U.S. Appl. No. 09/363,966, filed Jul. 29, 1999.

Oct. 1, 2004. International Preliminary Examination Report for PCT Serial No. PCT/US03/23964.

Oct. 6, 2004. Office Action for U.S. Appl. No. 10/759,108, filed Jan. 20, 2004.

Oct. 12, 2004. International Preliminary Examination Report for PCT Serial No. PCT/US02/19061.

Nov. 17, 2004. Written Opinion for PCT Serial No. PCT/US01/27407.

Aug. 9, 2004. Written Opinion for PCT Serial No. PCT/US02/19063.

IslamRaja, M. M., C. Chang, J. P. McVittie, M. A. Cappelli, and K. C. Saraswat. May/Jun. 1993. "Two Precursor Model for Low-Pressure Chemical Vapor Deposition of Silicon Dioxide from Tetraethylorthosilicate." *J. Vac. Sci. Technol. B*, vol. 11, No. 3, pp. 720-726.

Kim, Eui Jung and William N. Gill. Jul. 1994. "Analytical Model for Chemical Vapor Deposition of $SiO_2$ Films Using Tetraethoxysliane and Ozone" (Abstract). *Journal of Crystal Growth*, vol. 140, Issues 3-4, pp. 315-326.

Guo, R.S, A. Chen, C.L. Tseng, I.K. Fong, A. Yang, C.L. Lee, C.H. Wu, S. Lin, S.J. Huang, Y.C. Lee, S.G. Chang, and M.Y. Lee. Jun. 16-17, 1998. "A Real-Time Equipment Monitoring and Fault Detection System." *Semiconductor Manufacturing Technology Workshop*, pp. 111-121.

Lantz, Mikkel. 1999. "Equipment and APC Integration at AMD with Workstream." *IEEE*, pp. 325-327.

Jul. 15, 2004. Office Action for U.S. Appl. No. 10/172,977, filed Jun. 18, 2002.

Aug. 2, 2004. Office Action for U.S. Appl. No. 10/174,377, filed Jun. 18, 2002.

Aug. 18, 2004. International Preliminary Examination Report for PCT Serial No. PCT/US02/19116.

Aug. 24, 2004. Office Action for U.S. Appl. No. 10/135,405, filed May 1, 2002.

Aug. 25, 2004. Office Action for U.S. Appl. No. 09/998,384, filed Nov. 30, 2001.

Sep. 9, 2004. Written Opinion for PCT Serial No. PCT/US02/21942.

Sep. 16, 2004. International Preliminary Examination Report for PCT Serial No. PCT/US02/24859.

Mar. 4, 2005. International Preliminary Examination Report from PCT Application No. PCT/US02/19063.

Boning, Duane et al. "Run by Run Control of Chemical-Mechanical Polishing." *IEEE Trans*. Oct. 1996. vol. 19, No. 4. pp. 307-314.

Moyne, James et al. "A Run-to-Run Control Framework for VLSI Manufacturing." *Microelectronic Processing '93 Conference Proceedings*. Sep. 1993.

Telfeyan, Roland et al. "Demonstration of a Process-Independent Run-to-Run Controller." *187th Meeting of the Electrochemical Society*. May 1995.

Moyne, James et al. "A Process-Independent Run-to-Run Controller and Its Application to Chemical-Mechanical Planarization." *SEMI/IEEE Adv. Semiconductor Manufacturing Conference*. Aug. 15, 1995.

Moyne, James et al. "Adaptive Extensions to be a Multi-Branch Run-to-Run Controller for Plasma Etching." *Journal of Vacuum Science and Technology*. 1995.

Sachs, Emanuel et al. "Process Control System for VLSI Fabrication."

Chaudhry, Nauman et al. "Active Controller: Utilizing Active Databases for Implementing Multi-Step Control of Semiconductor Manufacturing." *University of Michigan*. pp. 1-24.

Chaudhry, Nauman et al. "Designing Databases with Fuzzy Data and Rules for Application to Discrete Control." *University of Michigan*. pp. 1-21.

Chaudhry, Nauman A. et al. "A Design Methodology for Databases with Uncertain Data." *University of Michigan*. pp. 1-14.

Khan, Kareemullah et al. "Run-to-Run Control of ITO Deposition Process." *University of Michigan*. pp. 1-6.

Moyne, James et al. "Yield Improvement @ Contact Through Run-to-Run Control."

Kim, Jiyoun et al. "Gradient and Radial Uniformity Control of a CMP Process Utilizing a Pre- and Post-Measurement Strategy." *University of Michigan*.

Guo, R.S, et al. "A Real-Time Equipment Monitoring and Fault Detection System." Semiconductor Manufacturing Technology Workshop, pp. 111-121. Jun. 16-17, 1998.

Labelle, C.B., Lau, K.K.S, Cruden B.A., Bailey, T.C., Casserly, T., Escobar, O., Sawin, H.H., and Gleason, K.K., "Chemical Vapor Deposition (CVD) of "Teflon-like" Thin Films for Use in Interlayer Dielectric Applications," Materials Research at MIT, Materials Processing Center, Massachusetts Institute of Technology, p. 38, 1999.

Rauf, Shahid and Mark J. Kushner. "Controller design issues in the feedback control of radio frequency plasma processing reactors." American Vacuum Society, pp. 704-712, May/Jun. 1999.

Rauf. S.; Kushner, M.J.,Semiconductor Manufacturing, IEEE, "Virtual plasma equipment model: a tool for investigating feedback control in plasma processing equipment," Transactions on vol. 11, Issue 3, Date: Aug. 1998, pp. 486-494.

PCT Search Report for PCT/US02/19063, dated Nov. 12, 2002 (P019PCT).

Notice of Allowance for U.S. Appl. No. 09/943,955, mailed Sep. 11, 2006 (P019).

Office Action for U.S. Appl. No. 09/943,955, mailed Jan. 31, 2006 (P019).

Office Action for U.S. Appl. No. 09/943,955, mailed Dec. 30, 2004 (P019).

Office Action for U.S. Appl. No. 09/943,955, mailed Jul. 26, 2005 (P019).

Office Action for U.S. Appl. No. 10/174,377, mailed Aug. 2, 2004 (P068).

Office Action for U.S. Appl. No. 10/174,377, mailed Feb. 25, 2005. (P068).

Office Action for U.S. Appl. No. 10/174,377, mailed May 31, 2006 (P068).

Office Action for U.S. Appl. No. 10/174,377, mailed Sep. 7, 2005 (P068).

Office Action for U.S. Appl. No. 11/701,401 mailed Aug. 7, 2009 (P068D).

Office Action for U.S. Appl. No. 11/701,401 mailed Jan. 28, 2010 (P068D).

Office Action for U.S. Appl. No. 11/701,401 mailed Feb. 5, 2009 (P068D).

Office Action for U.S. Appl. No. 11/701,401 mailed Jun. 23, 2010 (P068D).

Japanese Interrogation received for JP Application No. 2003-505993, mailed Jun. 15, 2010 (P019JP).

U.S. Appl. No. 09/943,383, filed Aug. 31, 2001, Shanmugasundram et al.

U.S. Appl. No. 09/943,955, filed Aug. 31, 2001, Shanmugasundram et al.

U.S. Appl. No. 09/998,372, filed Nov. 30, 2001, Paik.

U.S. Appl. No. 09/998,384, filed Nov. 30, 2001, Paik.

U.S. Appl. No. 10/084,092, filed Feb. 28, 2002, Arackaparambil et al.

U.S. Appl. No. 10/100,184, filed Mar. 19, 2002, Al-Bayati et al.

U.S. Appl. No. 10/135,405, filed May 1, 2002, Reiss et al.

U.S. Appl. No. 10/135,451, filed May 1, 2002, Shanmugasundram et al.

U.S. Appl. No. 10/172,977, filed Jun. 18, 2002, Shanmugasundram et al.

U.S. Appl. No. 10/173,108, filed Jun. 18, 2002, Shanmugasundram et al.

U.S. Appl. No. 10/174,370, filed Jun. 18, 2002, Shanmugasundram et al.

Chaudhry, Nauman, et. al, "Active Controller: Utilizing Active Databases for Implementing Multi-Step Control of Semiconductor Manufacturing," (Abstract), IEEE Transaction on Components, Packaging and Manufacturing Technology, part C, vol. 21, No. 3. pp. 217-224, Jul. 1998.

Good, Richard and Qin, S. Joe, Stability Analysis of Double EWMA Run-to-Run Control with Metrology Delay. Proceedings of the American Control Conference Anchorage, AK May 8-10, 2002, 6 pages.

Islamraja, M.M. et al., "Two precursor model for low-pressure chemical vapor deposition of silicon dioxide from tetraethylorthosilicate". J. Vac. Sci. Technol. B 11(3), May/Jun. 1983, pp. 720-726.

Kim, Eui Jung et al., "Analytical Model for Chemical Vapor Deposition of SiO2 films using tetraethoxysilane and ozone". Journal of Crystal Growth, vol. 140, Issues 3-4, Jul. 1994, pp. 315-326. Abstract Only.

Kim, Jiyoun, et al., "Gradient and Radial Uniformity Control of a CMP Process Utilizing a Pre- and Post-Measurement Strategy."

Kuo, W.W. Adaptive in-line Sampling Strategies for Semiconductors Manufacturing, ESRC 96-35, and CSM-35. Jan. 1997 (abstract only).

Kuo et al., "Effective In-Line Defect Monitoring with Variable Wafer Area Coverage", IEEE/SEMI Advanced Semiconductor Manufacturing Conference, 1997.

McIntyre, M., et al., "Key Considerations in the Development of Defect Sampling Methodologies". ASMC 96 Proceedings, IEEE/ SEMI 1996 (Nov. 1996): 81-85.

Nurani, et al. "The Impact of Lot-to-Lot and Wafter-toWafer Variations on SPC." IEEE (1997): 69-72.

Rauf, Shahid and Mark J. Kushner. "Controller design issues in the feedback control of radio frequency plasma processing reactors." American Vacuum Society, pp. 704-712, no date.

Semiconductor FABTECH, "Motorola and Advanced Micro Devices Buy ObjectSpace Catalyst Advanced Process Control Product for Five Wafer Fabs." Jul. 5, 2001 www.semiconductorfabtech.com/industry.news/9907/20.07.shtml 2 pages.

Souza, Adriano Mendonça, et al., "How to use EWMA to Achieve SPC and EPC Control," Nov. 1999 International Symposium on NDT Contribution to the Infrastructure Safety Systems, Tores Brazil (abstract only), pp. 270-277.

Applied Materials Software Office Action for U.S. Appl. No. 09/943,955, mailed May 5, 2004.

Applied Materials Software Office Action for U.S. Appl. No. 09/943,955, mailed Dec. 30, 2004.

Applied Materials Software Office Action for U.S. Appl. No. 09/943,955, mailed Jul. 26, 2005.

Applied Materials Software Office Action for U.S. Appl. No. 09/943,955, mailed Jan. 31, 2006.

Applied Materials Software Notice of Allowance for U.S. Appl. No. 09/943,955, mailed Sep. 11, 2006.

Applied Materials Software Office Action for U.S. Appl. No. 10/135,451, mailed Jul. 27, 2009.

Applied Materials Software Office Action for U.S. Appl. No. 10/135,451, mailed Jan. 30, 2009.

Applied Materials Software Office Action for U.S. Appl. No. 10/135,451, mailed Aug. 14, 2008.

Applied Materials Software Office Action for U.S. Appl. No. 10/135,451, mailed Mar. 17, 2008.

Applied Materials Software Office Action for U.S. Appl. No. 10/135,451, mailed Sep. 28, 2007.

Applied Materials Software Office Action for U.S. Appl. No. 10/135,451, mailed Dec. 20, 2006.

Applied Materials Software Office Action for U.S. Appl. No. 10/135,451, mailed Apr. 6, 2006.

Applied Materials Software Office Action for U.S. Appl. No. 11/701,401, mailed Feb. 5, 2009.

Applied Materials Software Office Action for U.S. Appl. No. 11/701,401, mailed Aug. 7, 2009.

Applied Materials Software Office Action for U.S. Appl. No. 10/174,377, mailed Aug. 2, 2004.

Applied Materials Software Office Action for U.S. Appl. No. 10/174,377, mailed Feb. 25, 2005.

Applied Materials Software Office Action for U.S. Appl. No. 10/174,377, mailed Sep. 7, 2005.

Applied Materials Software Office Action for U.S. Appl. No. 10/174,377, mailed May 31, 2006.

US 6,150,664, 11/2000, Su (withdrawn)

* cited by examiner

FEEDBACK CONTROL OF CHEMICAL MECHANICAL POLISHING DEVICE PROVIDING MANIPULATION OF REMOVAL RATE PROFILES

CROSS-REFERENCE TO RELATED APPLICATIONS

This application is a divisional of and claims priority under 35 U.S.C. §121 to U.S. patent application Ser. No. 09/943,955, filed on Aug. 31, 2001, which claims priority under 35 U.S.C. §119(e) from U.S. Provisional Patent Application No. 60/298,878 filed Jun. 19, 2001.

FIELD OF THE INVENTION

The present invention generally relates to the planarization of substrates, in particular, semiconductor wafers, and more particularly to a method and apparatus for providing feedback control of the planarization process.

BACKGROUND OF THE INVENTION

Chemical-mechanical polishing (CMP) is used in semiconductor fabrication processes for obtaining full planarization of a semiconductor wafer. The method involves removing material, e.g., a sacrificial layer of surface material, from the wafer (typically, silicon dioxide ($SiO_2$)) using mechanical contact and chemical erosion. Polishing flattens out height differences, since areas of high topography (hills) are removed faster than areas of low topography (valleys).

CMP typically utilizes an abrasive slurry dispersed in an alkaline or acidic solution to planarize the surface of the wafer through a combination of mechanical and chemical action. Generally, a CMP tool includes a polishing device (having an attached wafer to be polished) positioned above a rotatable circular platen on which a polishing pad is mounted. In use, the platen may be rotated and an abrasive slurry is introduced onto the polishing pad. Once the slurry has been applied to the polishing pad, a downward force may be applied to a rotating head to press the attached wafer against the pad. As the wafer is pressed against the polishing pad, the wafer is mechanically and chemically polished.

The effectiveness of a CMP process may be measured by its polishing rate, and by the resulting finish (absence of small-scale roughness) and flatness (absence of large-scale topography) of the substrate surface. The polishing rate, finish and flatness are determined by a variety of factors, including the pad and slurry combination, the relative speed between the substrate and pad and the force pressing the substrate against the polishing pad.

As semiconductor processes are scaled down, the importance of CMP to the fabrication process increases. In particular, it is increasingly important to control and minimize within wafer (WIW) thickness non-uniformity. A variety of factors may contribute to producing variation across the surface of a wafer during polishing. For example, variations in the surface topography may be attributed to drift of the processing conditions in the CMP device. Typically, the CMP device is optimized for a particular process, but because of chemical and mechanical changes to the process, e.g., changes in the polishing pad during polishing, degradation of process consumables, and other factors, the CMP process may drift from its optimized state. In addition to processing drift, the wafer surface coming into the CMP process may be non-uniform, which exacerbates the process-induced variations across the post-polished surface.

Recent attempts to correct processing drift include feedback control, in which information generated during current processing is used to adjust future processing runs. One control variable used in such feedback control of the polishing step includes the arm oscillation length of the polishing tool. Feedback loops have also been developed for optimization of polishing pad conditioning. However, these schemes are still not adequate in today's manufacturing environment to satisfactorily compensate for the aforementioned effects.

The present invention is directed to overcoming, or at least reducing the effects of, one or more of the problems set forth above.

SUMMARY OF THE INVENTION

The present invention relates to a method, apparatus and medium for planarizing a surface of a substrate, for example, a semiconductor wafer, in order to improve run-to-run control over the wafer thickness profile. The present invention uses a model (which can be implemented as a single model or multiple models) of the planarization process to predict material removal across the wafer surface and to improve within wafer thickness uniformity. Deviations from the predicted outcome are used to set new polishing parameters, which feedback into the process to enhance process results.

In one aspect of the present invention, a method of producing a uniform wafer thickness profile in a polishing operation includes (a) providing a model for a wafer polishing that defines a plurality of regions on a wafer and identifies a wafer material removal rate in a polishing step for each of the regions, and (b) polishing a wafer using a polishing recipe that generates a target thickness profile for each region.

In another aspect of the present invention, a method of controlling surface non-uniformity of a wafer in a polishing operation includes (a) providing a model for a wafer polishing that defines a plurality of regions on a wafer and identifies a wafer material removal rate in a polishing step of a polishing process for each of the regions, wherein the polishing process includes a plurality of polishing steps, (b) polishing a wafer using a first polishing recipe based upon an incoming wafer thickness profile, (c) determining a wafer thickness profile for the post-polished wafer of step (b), and (d) calculating an updated polishing recipe based upon the wafer thickness profile of step (c) and the model of step (a) to maintain a target wafer thickness profile.

In at least some embodiments of the present invention, the first polishing recipe is based on the model of step (a) to obtain the target wafer thickness profile, or the first polishing recipe is determined empirically.

In at least some embodiments of the present invention, the plurality of regions in the model of step (a) includes regions extending radially outward from a center point on the wafer. The model may include four or more regions.

In at least some embodiments of the present invention, the polishing of step (b) includes polishing the wafer at a plurality of polishing stations. The polishing step may be carried out at three polishing stations.

In at least some embodiments of the present invention, the polishing recipe is the same at at least two polishing stations.

In at least some embodiments of the present invention, the polishing recipe is different at at least two polishing stations.

In at least some embodiments of the present invention, calculating the updated polishing recipe of step (c) includes calculating updated polishing recipes for each of the plurality of polishing stations.

In at least some embodiments of the present invention, the updated polishing recipes for each of the plurality of polishing stations accounts for the tool state of the individual polishing stations. The wafer thickness profile for each of the subsequent polishing stations may be provided by the prediction from previous stations.

In at least some embodiments of the present invention, the step of providing a model includes (e) measuring pre-polished wafer thickness in each of a plurality of regions defined on one or more wafers, (f) polishing the one or more wafers, wherein polishing includes polishing the one or more wafers in a plurality of polishing steps, (g) measuring the wafer material removal rate for the one or more wafers at each of the plurality of regions after each of the polishing steps of step (g), (h) providing a model defining the effect of tool state on polishing effectiveness, and (i) recording the pre-polished and post-polished wafer thicknesses for each or the regions on a recordable medium. The model may further include fitting the data to a linear or non-linear curve that establishes a relationship between the material removal rate of a region of the wafer and a polishing parameter of interest.

In at least some embodiments of the present invention, polishing parameter includes polishing time. The polishing parameters may further include a parameter selected from the group consisting of polishing time, polishing pad down forces and velocity, slurry flow and composition, conditioning time, conditioning disk down forces and velocity, oscillating speeds of both the conditioning disk and the wafer carrier.

In at least some embodiments of the present invention, wafer removal for a region j ($AR'_j$) in the model of step (a) is determined according to the equation:

$$AR'_j = (c_{11j} \cdot x_1 + c_{12j}) \cdot t_1 + (c_{21j} \cdot x_2 + c_{22j}) \cdot t_2 + (c_{31j} \cdot x_3 + c_{32j}) \cdot t_3 + (c_{41j} \cdot x_1 + c_{42j}) \cdot t_4 + (c_{51j} \cdot x_5 + c_{52j}) \cdot t_5,$$

where $x_1$, $x_2$, $x_3$, $x_4$, and $x_5$ are the additional parameter values for polishing steps 1, 2, 3, 4, and 5, respectively; $t_1$, $t_2$, $t_3$, $t_4$, and $t_5$ are the polishing times for polishing steps 1, 2, 3, 4, and 5, respectively, and $c_{a1j}$ provides the contribution to wafer removal of the variable x in polishing step a in region j; and $c_{a2j}$ provides the contribution to wafer removal of polishing time in polishing step a. The wafer material removal rate profile may account for tool state by scaling the profile using the scaling factor:

$$(1 + k_p \cdot t_p + k_d \cdot t_d + k_{pd} \cdot t_p \cdot t_d),$$

where the terms $t_p$ and $t_d$ refer to pad and disk life, respectively, with units of hour; and the terms $k_p$, $k_d$ and $k_{pd}$ are empirically determined coefficients relating pad and disk life to removal rate.

In at least some embodiments of the present invention, an updated polishing recipe is attained by solving the equation:

$$\min_x f(y^{sp}, g(x))$$

where x is a vector of times and other processing parameters corresponding to the polishing recipe; g(x) is the model for the polishing process, $y^{sp}$ is a vector of the desired average region wafer thicknesses; and $f(y^{sp}, g(x))$ is a penalty function to penalize the deviation between the model predictions g(x) and the desired thicknesses $y^{sp}$.

In another aspect of the present invention, a method of determining a model for wafer thickness profile includes (a) measuring pre-polished wafer thickness in each of a plurality of regions defined on one or more wafers, (b) polishing the one or more wafers, wherein polishing includes polishing the one or more wafers in a plurality of polishing steps, (c) measuring the wafer material removal rate for the one or more wafers at each of the plurality of regions after each of the polishing steps of step (b), (d) providing a model defining the effect of tool state on polishing effectiveness, and (e) recording the pre-polished and post-polished wafer thicknesses for each or the regions on a recordable medium. The model may include fitting the data to a linear or non-linear curve that establishes a relationship between the material removal rate of a region of the wafer and a polishing parameter of interest.

In at least some embodiments of the present invention, the polishing parameter includes polishing time. The polishing parameters may include a parameter selected from the group consisting of polishing time, polishing pad down forces and velocity, slurry flow and composition, conditioning time, conditioning disk down forces and velocity, oscillating speeds of both the conditioning disk and the wafer carrier.

In at least some embodiments of the present invention, the wafer material removal for a region j ($AR'_j$) in the model of step (a) is determined according to the equation:

$$AR'_j = (c_{11j} \cdot x_1 + c_{12j}) \cdot t_1 + (c_{21j} \cdot x_2 + c_{22j}) \cdot t_2 + (c_{31j} \cdot x_3 + c_{32j}) \cdot t_3 + (c_{41j} \cdot x_1 + c_{42j}) \cdot t_4 + (c_{51j} \cdot x_5 + c_{52j}) \cdot t_5,$$

where $x_1$, $x_2$, $x_3$, $x_4$, and $x_5$ are the additional parameter values for polishing steps 1, 2, 3, 4, and 5, respectively; $t_1$, $t_2$, $t_3$, $t_4$, and $t_5$ are the polishing times for polishing steps 1, 2, 3, 4, and 5, respectively, and $c_{a1j}$ provides the contribution to wafer removal of the variable x in polishing step a in region j; and $c_{a2j}$ provides the contribution to wafer removal of polishing time in polishing step a. The wafer material removal rate profile may account for tool state by scaling the profile using the scaling factor:

$$(1 + k_p \cdot t_p + k_d \cdot t_d + k_{pd} \cdot t_p \cdot t_d),$$

where the terms $t_p$ and $t_d$ refer to pad and disk life, respectively, with units of hour; and the terms $k_p$, $k_d$ and $k_{pd}$ are empirically determined coefficients relating pad and disk life to removal rate.

In at least some embodiments of the present invention, a the model is determined using less than 10 wafers.

In one aspect of the present invention, an apparatus for conditioning polishing pads used to planarize substrates is provided having a carrier assembly having a plurality of arms for holding a wafer positionable over a plurality of planarizing surfaces of a plurality of polishing pads, controlling means capable of controlling an operating parameter of the polishing process, and a controller operatively coupled to the controlling means, the controller operating the controlling means to adjust the operating parameter of the polishing process as a function of a model for a wafer thickness profile, the model including defining a polishing model that defines a plurality of regions on a wafer and identifies a wafer material removal rate in a polishing step of a polishing process for each of the regions, wherein the polishing process includes a plurality of polishing steps.

In at least some embodiments of the present invention, the model defines wafer removal for a region j ($AR'_j$) in the wafer material removal rate model according to the equation:

$$AR'_j = (c_{11j} \cdot x_1 + c_{12j}) \cdot t_1 + (c_{21j} \cdot x_2 + c_{22j}) \cdot t_2 + (c_{31j} \cdot x_3 + c_{32j}) \cdot t_3 + (c_{41j} \cdot x_1 + c_{42j}) \cdot t_4 + (c_{51j} \cdot x_5 + c_{52j}) \cdot t_5,$$

where $x_1$, $x_2$, $x_3$, $x_4$, and $x_5$ are the additional parameter values for polishing steps 1, 2, 3, 4, and 5, respectively; $t_1$, $t_2$, $t_3$, $t_4$, and $t_5$ are the polishing times for polishing steps 1, 2, 3, 4, and 5, respectively, and $c_{a1j}$ provides the contribution to wafer removal of the variable x in polishing step a in region j; and $c_{a2j}$ provides the contribution to wafer removal of polishing time in polishing step a.

In another aspect of the present invention, a computer readable medium includes instructions being executed by a computer, the instructions including a computer-implemented software application for a chemical mechanical polishing process, and the instructions for implementing the process include (a) receiving data from a chemical mechanical polishing tool relating to the wafer removal rate of at least one wafer processed in the chemical mechanical polishing process, and (b) calculating, from the data of step (a), updated polishing recipe, wherein the updated polishing recipe is calculated by determining the difference between an output of a wafer material removal rate model and the data of step (a).

In at least some embodiments of the present invention, the model for a wafer material removal rate defines a plurality of regions on a wafer and identifies a wafer material removal rate in a polishing step of a polishing process for each of the regions, wherein the polishing process includes a plurality of polishing steps.

In at least some embodiments of the present invention, the wafer removal for a region j ($AR'_j$) in the wafer material removal rate model is determined according to the equation:

$$AR'_j = (c_{1j} \cdot x_1 + c_{12j}) \cdot t_1 + (c_{21j} \cdot x_2 + c_{22j}) \cdot t_2 + (c_{31j} \cdot x_3 + c_{32j}) \cdot t_3 + (c_{41j} \cdot x_1 + c_{42j}) \cdot t_4 + (c_{51j} \cdot x_5 + c_{52j}) \cdot t_5,$$

where $x_1$, $x_2$, $x_3$, $x_4$, and $x_5$ are the additional parameter values for polishing steps 1, 2, 3, 4, and 5, respectively; $t_1$, $t_2$, $t_3$, $t_4$, and $t_5$ are the polishing times for polishing steps 1, 2, 3, 4, and 5, respectively; and $c_{a1j}$ provides the contribution to wafer removal of the variable x in polishing step a in region j; and $c_{a2j}$ provides the contribution to wafer removal of polishing time in polishing step a.

The term "target wafer thickness profile" represents the desired processing outcome of the CMP process. Some tolerance is built into the profile, so that a feedback control system defines a target profile and acceptable standard deviations therefrom, wherein such deviations would not require updating of the polishing recipe. Use of the term target wafer thickness profile includes the target and the standard deviation therefrom.

The term wafer is used in a general sense to include any substantially planar object that is subject to polishing. Wafers include, in additional to monolith structures, substrates having one or more layers or thin films deposited thereon. Throughout the specification, wafer and thin film may be used interchangeably, unless otherwise indicated.

"Tool state" refers to the condition of the consumable or variable components of the CMP apparatus. Most often this term is used to refer to the state of the conditioning disk and polishing pad, which change continually over the lifetime of the pads, and idle time. Typical conditioning disk life is about 60 hours and typical polishing pad life is about 30 hours.

BRIEF DESCRIPTION OF THE DRAWINGS

Various objects, features, and advantages of the present invention can be more fully appreciated with reference to the following detailed description of the invention when considered in connection with the following drawing, in which like reference numerals identify like elements. The following drawings are for the purpose of illustration only and are not intended to be limiting of the invention, the scope of which is set forth in the claims that follow:

DETAILED DESCRIPTION OF THE INVENTION

Figure 1:
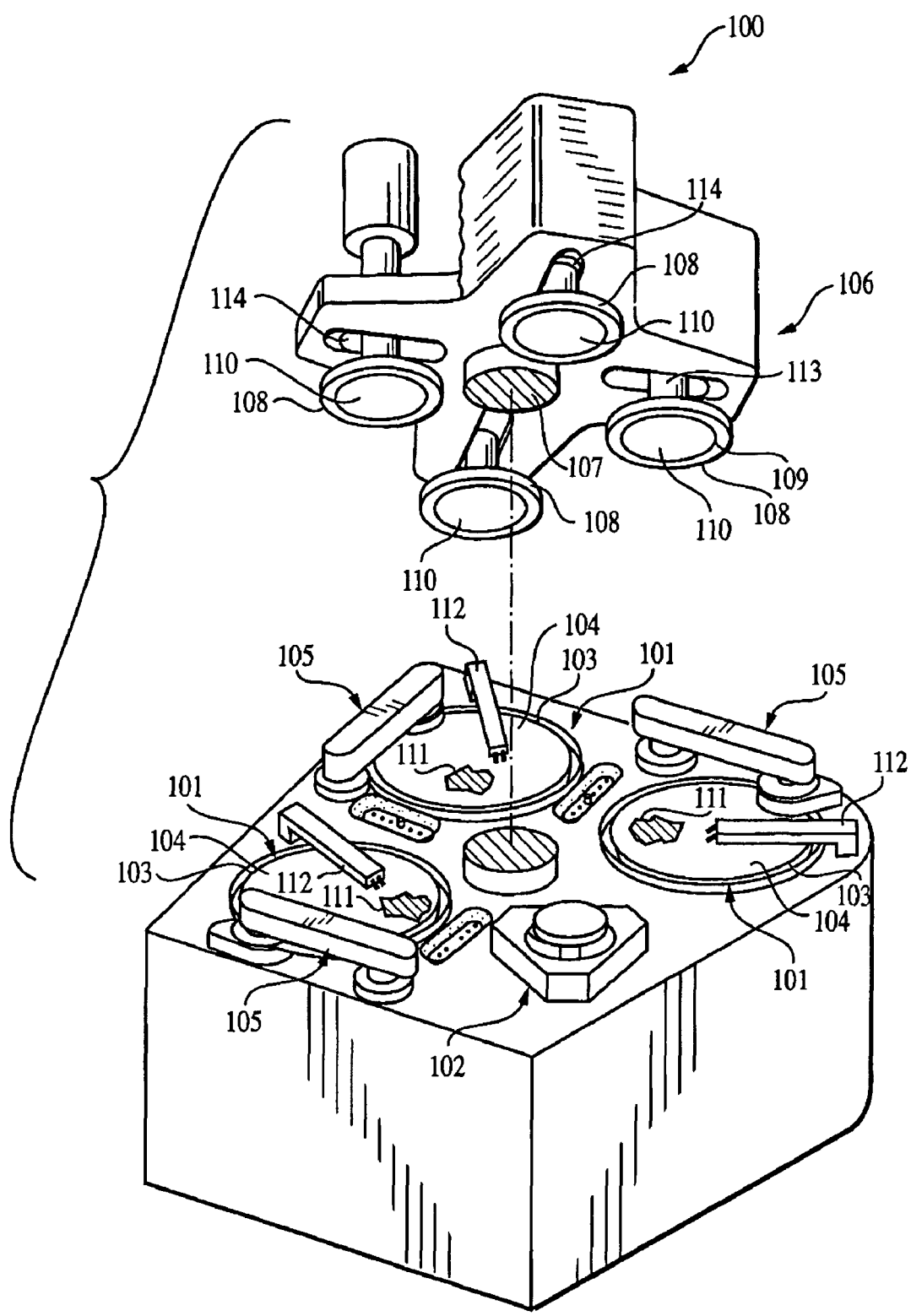
FIG. 1 is a perspective view of a chemical mechanical polishing apparatus.

FIG. 1 shows a perspective view of a typical CMP apparatus 100 for polishing one or more substrates 110. The CMP apparatus 100 includes a series of polishing stations 101 and a transfer station 102 for loading and unloading substrates. Each polishing station includes a rotatable platen 103 on which is placed a polishing pad 104. A source of polishing fluid 111 may be provided to supply polishing fluid 112 to the polishing pad 104. Each polishing station may include an associated pad conditioning apparatus 105 to maintain the abrasive condition of the polishing pad. A rotatable multi-head carousel 106 is supported by center post 107 about which the carousel rotates. The carousel 106 includes multiple carrier heads 108 that are capable of independently rotating about its own axis. The carrier head 108 receives a substrate from and delivers a substrate to the transfer station 102. The carrier head provides a controllable load, i.e., pressure on the substrate to push is against the polishing pad when the polishing station and the carrier head are engaged. Some carrier heads include a retaining ring 109 to hold the substrate and help to provide the polishing load. To effectuate polishing, the platen 103 may be rotated (typically at a constant speed). Moreover, individually variable down forces may be applied by each of the carrier heads 108, for example by adjusting retaining ring pressures. The carrier heads 108 holding substrates 110 can rotate on axis 113 and oscillate back and forth in slot 114.

Figure 2:
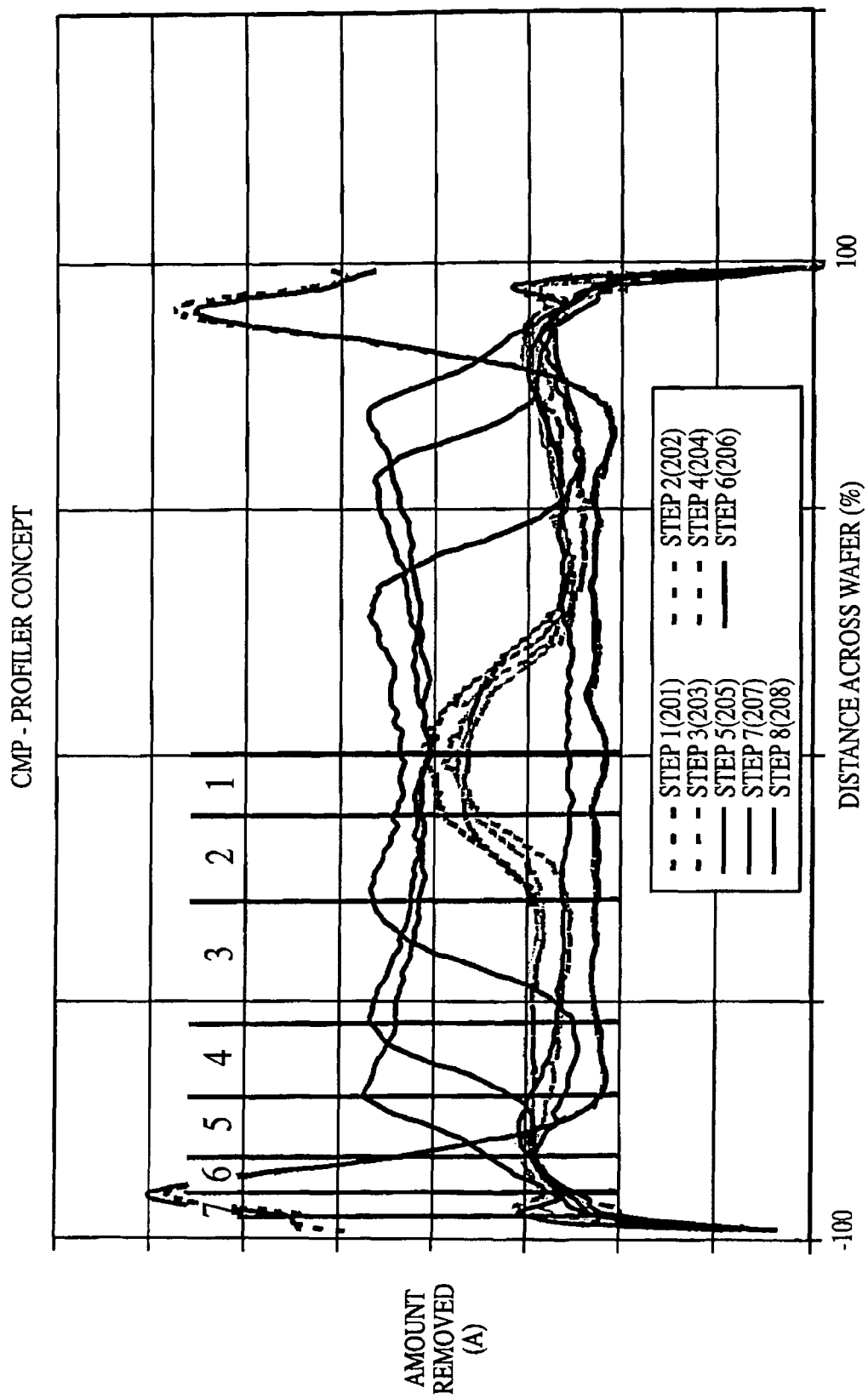
FIG. 2 is a plot of oxide material removal (Å) across the surface of a substrate for successive polishing steps in a polishing recipe.

One type of CMP process polishes the wafer in a series of polishing steps. By way of example, FIG. 2 shows a CMP profile for eight successive polishing steps 201 through 208 for a single wafer 200 mm in diameter. Each polishing step removes a subset of the total material to be polished from the substrate surface. Moreover, the thickness profile generated by each polishing step may be different, as is seen by comparison of profiles 201 and 208. The final, thin film thickness profile is the sum of the individual polishing step thickness profiles and desirably produces a uniform wafer thickness across the surface.

A CMP process may include the transport of a sample from polishing station (platen) to polishing station (platen). One type of CMP process distributes wafer removal among the various platens, and each platen will have a full set of polishing steps to achieve the desired material removal for that platen. Any combination of removal is possible. Thus, by way of example, where it is desired to remove 6000 Å of material in total, 3000 Å may be removed from the polishing station at platen 1, 1000 Å may be removed at platen 2, and 2000 Å may be removed at platen 3. The polishing recipe for each platen may be the same or different.

The CMP processes described above may be modeled to provide a format for improving the planarization process. The model can be represented as raw data that reflects the system, or it can be represented by equations, for example multiple input-multiple output linear, quadratic and non-linear equations, which describe the relationship among the variables of the system. By using a model, the within wafer thickness uniformity can be improved or maintained run-to-run by adjusting the polishing parameters during wafer polishing to correct for unmodeled effects or to correct for drift in the polishing process conditions. By way of example, polishing time, polishing pad down forces and velocity, slurry flow and composition, conditioning time, conditioning disk down forces and velocity, oscillating speeds of both the conditioning disk and the wafer carrier may be adjusted during the polishing operation in a feedback and feedforward loop that predicts and then optimizes the polishing recipe.

Figure 3:
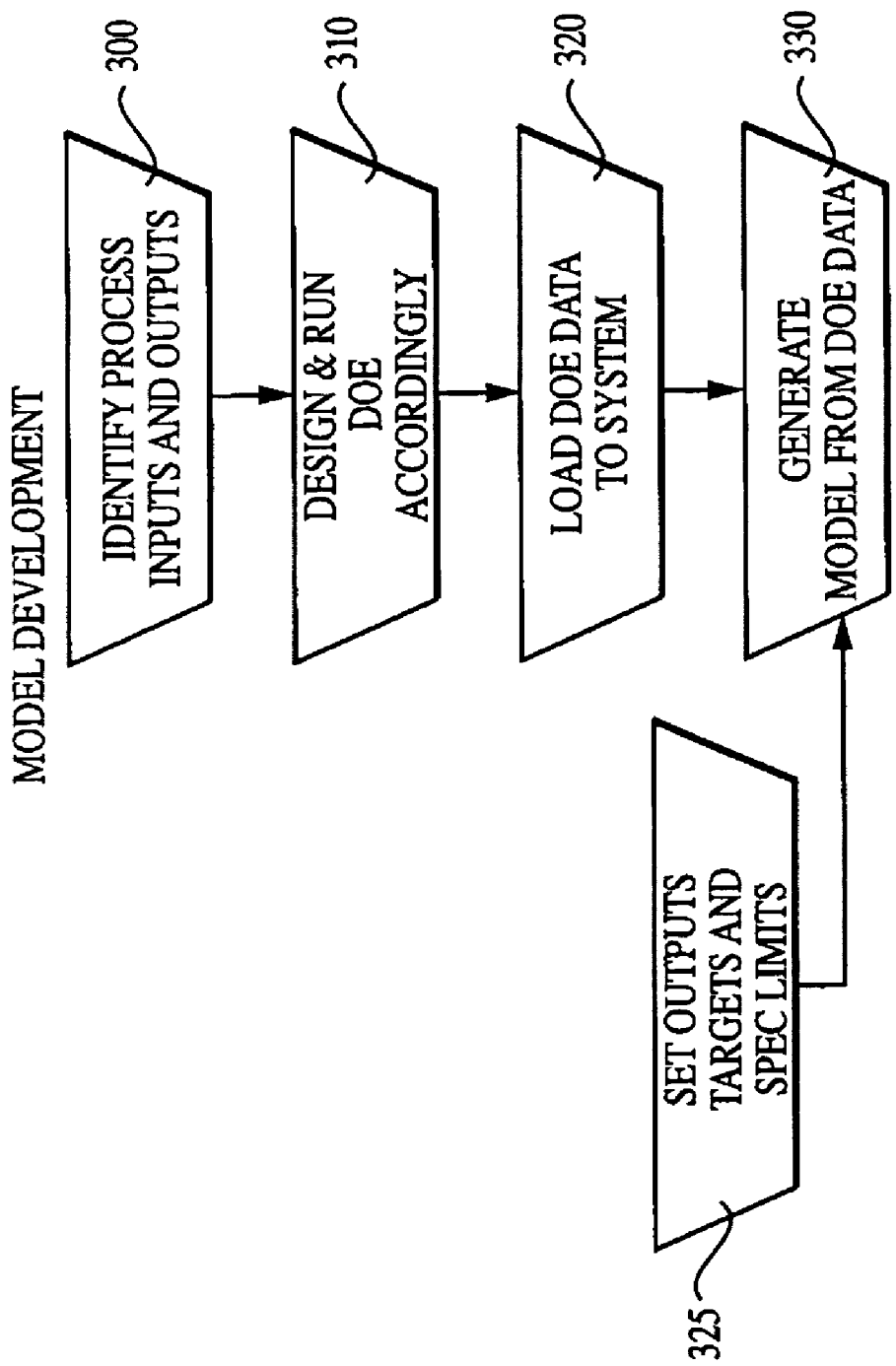
FIG. 3 is a flow diagram generally illustrating model development.

According to at least some embodiments of the present invention, an initial model is developed based upon knowledge of the wafer polishing process, as is shown in a flow diagram (FIG. 3). An initial understanding of the system is acquired in step 300, which is used to design and run a design of experiments (DOE) of step 310. The DOE desirably is designed to establish the relationship between or among variables that have a strong and predictable impact on the processing output one wishes to control, e.g., wafer thickness. The DOE provides data relating to process parameters and process outcome, which is then loaded to the advanced process control system in step 320. The advanced processing control system may be a controller or computer that uses the data to create and update the model. Processing requirements such as output targets and process specification are determined by the user in step 325, which are combined with the DOE data to generate a working model in step 330.

An illustrative example of model development is now described. According to at least some embodiments of the present invention, a model structure is defined that models wafer material removal rate (polishing) profiles as independent steps in the CMP process. As described herein above (FIG. 2), the individual steps may be combined to produce a uniform, final wafer thickness. The steps to be used in the model can also be defined as subsets of removal rate profiles; that is, a step may consist of a family of removal rate profiles that have similar characteristics. For each family of removal rate profiles, polishing parameters are identified, which may be varied, and their effect on the outcome is determined. Exemplary polishing variables, which may be included in this model include, but are not limited to, polishing time, polishing pad down forces and velocity, slurry flow and composition, conditioning time, conditioning disk down forces and velocity, and sweep speeds of both the conditioning disk and the wafer carrier.

Figure 4:
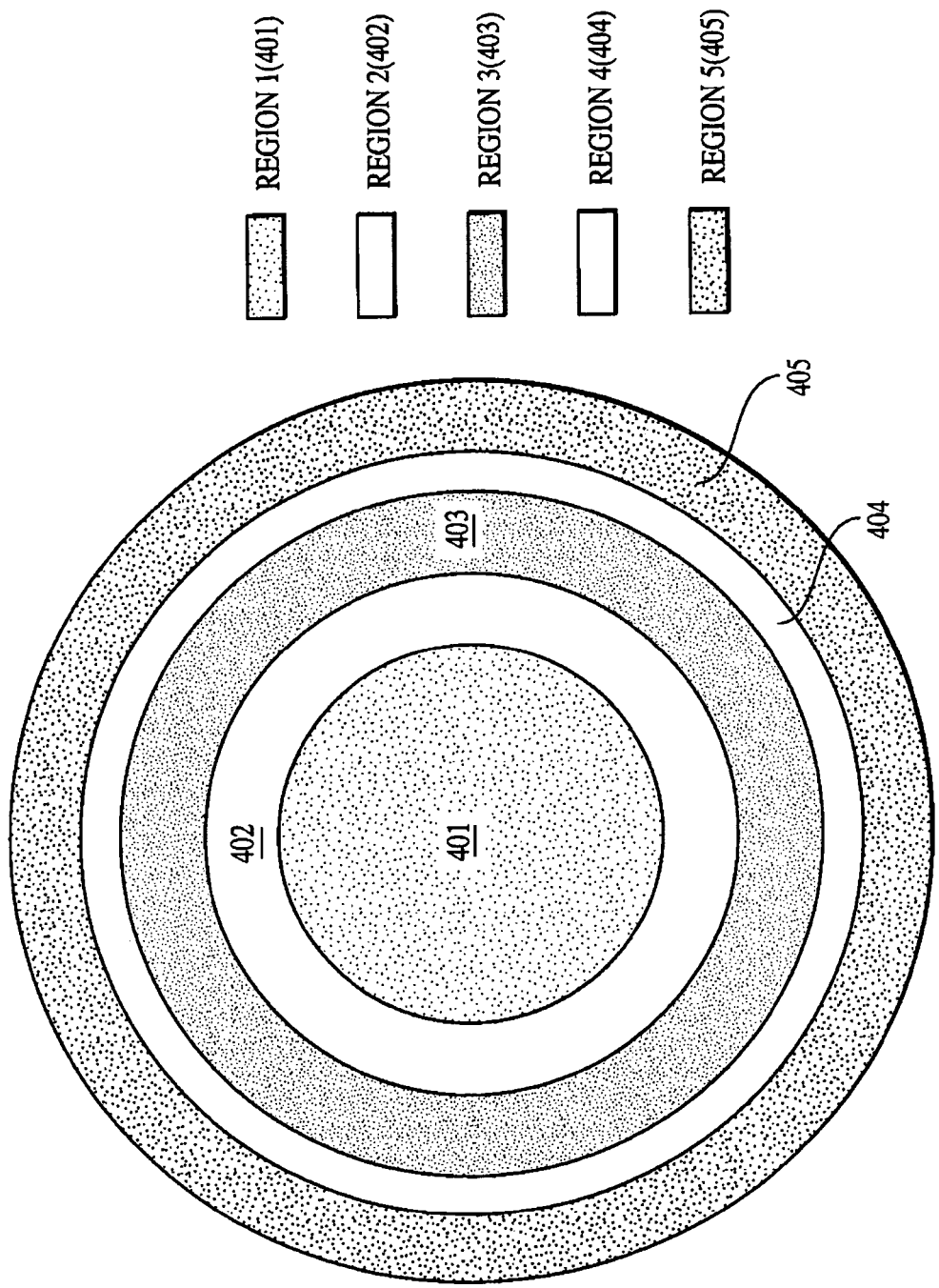
FIG. 4 is a schematic illustration of a wafer showing regions defined for thickness profile model.

In at least some embodiments of the present invention, the model relies on removal rate profiles based on regions of the wafer. As is shown in FIG. 4, a wafer may be divided into radial regions 401 through 405 of varying width and area. The number of regions is not set for the model and may be selected based upon the polishing profile. Thus, for example, FIG. 2 designates seven (7) regions across the wafer, while FIG. 4 illustrates five (5). The size and location of the regions also may vary and may be selected based upon the effect of certain polishing parameters on the wafer in that region.

The number, size and location of regions may be selected based upon the complexity of the wafer material removal rate profile. In at least some embodiments, it is desirable that the profile in any given region be substantially uniform, particularly in those cases where a number of wafer thickness measurement within a region are averaged to define the region-averaged thickness profile. Thus, at the edges where edge effects can be dramatic, narrow regions encompassing only the outer regions may be selected. Near the center of the wafer where polishing effects may be more subtle, a larger region may be defined. The regions are defined such that all azimuthal variation is averaged out since the CMP tool can not correct for such variation. Film thickness measurements taken within a region of the wafer are averaged to give the average thickness for that region.

To obtain DOE data, a polishing step is run and, based upon incoming measurements, e.g., pre-polishing and post-polishing wafer thickness measurements, and processing parameter values, a removal rate profile or, equivalently, a wafer thickness profile, can be determined for each region. Conventionally, data may be acquired empirically, by carrying out a series of experiments over a range of parameter values and over the lifetime of the polishing pad and conditioning disk. Such an approach makes no assumptions about the processing characteristics of the polishing operation, and the data is fit to the appropriate curve to define the model. This approach requires a large number of wafers, at least 30 for a 4 step process, and is time consuming (a typical disk life is about 60 hours).

In at least some embodiments of the present invention, a modified approach to obtaining DOE data is used. The approach assumes that the data may be fit to a linear curve and that superposition is valid. Superposition assumes that the same results are attained by performing a first step for a set time, followed by performing a second step for a set time, e.g., separately, but sequentially, as are attained by running the two steps together. In addition, the approach uses an established model to relate pad and disk life to polishing performance. These assumptions significantly reduce the amount of data (and hence number of samples) required to model the system appropriately. In at least some embodiments of the present invention, it is sufficient to run less than 10, and even 6-8 wafer for proper model development. By way of example only, the DOE may include 5-7 polishing steps and the polishing recipe may be carried out on a few wafers, as few as one, or for example 5-8 wafers. More wafers are required for polishing recipes with more polishing steps.

By way of example, a series of experiments may be conducted for a polishing system of interest as described above for determining the relationship between wafer material removal rate profile and polishing time and other parameters of interest. Standard polishing procedures may be used, with all polishing pad and wafer conditions held constant with the exception of the parameter(s) under investigation. Exemplary polishing parameters that may be held constant include polishing pad size, polishing pad composition, wafer composition, pad conditioning time, rotational velocity of the polishing pad, and rotational velocity of the wafer. In at least some embodiments of the present invention, the parameters under investigation include at least the polishing time for each of the polishing steps in the polishing recipe and the polishing down force (P), as defined by retaining ring pressure. As is shown in greater detail in the analysis that follows, additional parameters may be incorporated into the model.

Once data from DOE runs are obtained, a model may be developed. A model having five-polishing steps may be defined as follows:

$$AR'_j = c_{1j} \cdot t_1 + c_{2j} \cdot t_2 + c_{3j} \cdot t_3 + c_{4j} \cdot t_4 + c_{5j} \cdot t_5, \quad (1)$$

Where $AR'_j$ is the amount of material removed for region j of the wafer; $t_1$, $t_2$, $t_3$, $t_4$, and $t_5$ are the polishing times for polishing steps 1, 2, 3, 4, and 5, respectively; and $c_{1j}$, $c_{2j}$, $c_{3j}$, $c_{4j}$, and $c_{5j}$ are removal rates for region j in polishing steps 1, 2, 3, 4, and 5, respectively.

Additional parameters may be included in the model, and the model may be defined as follows:

$$AR'_j = (c_{11j} \cdot x_1 + c_{12j}) \cdot t_1 + (c_{21j} \cdot x_2 + c_{22j}) \cdot t_2 + (c_{31j} \cdot x_3 + c_{32j}) \cdot t_3 + (c_{41j} \cdot x_1 + c_{42j}) \cdot t_4 + (c_{51j} \cdot x_5 + c_{52j}) \cdot t_5, \quad (2)$$

where $x_1$, $x_2$, $x_3$, $x_4$, and $x_5$ are the additional parameter values for polishing steps 1, 2, 3, 4, and 5, respectively; $t_1$, $t_2$, $t_3$, $t_4$, and $t_5$ are the polishing times for polishing steps 1, 2, 3, 4, and 5, respectively, and $c_{a1j}$ provides the contribution to wafer removal rate of the variable x in polishing step a in region j; and $c_{a2j}$ provides the contribution to wafer removal rate of polishing time in polishing step a. Thus, the model permits inclusion of an unlimited number of processing parameters.

In at least some embodiments of the present invention, the model may be further augmented to include the effect of the tool state. The tool state represents the effect of wear, use and aging on the tool, and includes the condition of the conditioning disk and polishing pad, represented by disk life and pad life, and also includes idle time. This functionality may be expressed as a scaling factor. An exemplary scaling factor that takes pad life and disk life into account is shown in eq. 3.

$$AR_j = (1 + k_p \cdot t_p + k_d \cdot t_d + k_{pd} \cdot t_p \cdot t_d) \cdot (AR'_j |_{t_p=0, t_d=0}) \quad (3)$$

The terms $t_p$ and $t_d$ refer to pad and disk life, respectively, with units of hour; and the terms $k_p$, $k_d$ and $k_{pd}$ are empirically determined coefficients relating pad and disk life to removal rate, or equivalently, to the amount of material removed. $AR'_j$ at $t_p=0$ and $t_d=0$ is the amount of material removed under initial polishing conditions.

Using a model such as the one just described, a prediction for region-averaged, final wafer thickness can be calculated given incoming thickness, the pad and disk life, the polishing step times and the value for any other selected parameter for those steps which vary that parameter.

Process model development and optimization are carried out with reference to a specific polishing system. That is, the conditions that effect within wafer uniformity are specific to the type of wafer being polished, the slurry used in polishing and the composition of the polishing pad. Once a wafer/slurry/polishing pad system is identified, the system is characterized using the models developed according to the invention. In at least some embodiments of the present invention, it is envisioned that a separate model (or at least a supplement to a composite model) is created for each slurry/polishing pad wafer combination (i.e., for each different type/brand of slurry and each type/brand of pad that may be used in production with a given type of wafer).

Also, at least some embodiments of the present invention contemplate a wafer polishing model that can accommodate polishing at multiple platens, either in parallel or serially. The CMP process often consists of multiple platens, which are operated simultaneously. Typically, each platen removes a portion of the total amount of material to be removed. The wafers are advanced from platen to platen, and each platen has a separate recipe that determines the polishing step times and other processing parameters, such as retaining ring pressures for each of the steps that are performed on that platen.

Figure 6:
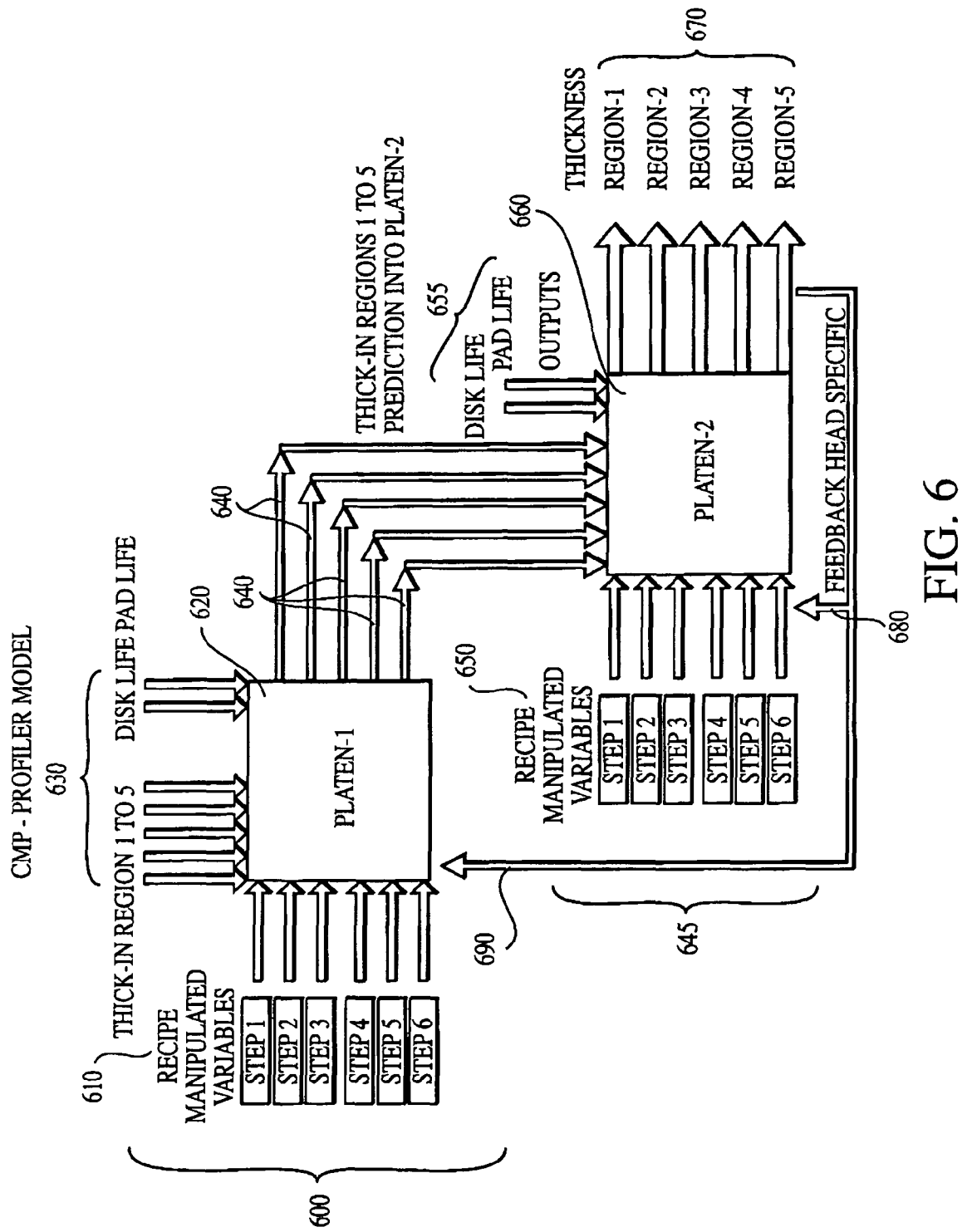
FIG. 6 is a schematic illustration of model development for a CMP process using two platens with different polishing recipes, as contemplated by at least some embodiments of the present invention.

A process model that accounts for the effects of multiple platens that perform similar or different polishing steps on wafer thickness profile is illustrated in FIG. 6. In a first phase 600 of the model, the polishing recipe 610 (here, 6 steps) for platen 1 620 is determined (the "first polishing process"). Process input data 630, such as incoming wafer thickness for the defined regions of the pre-polished wafer, disk life and pad life, are input into the model. The wafer is polished and final wafer thicknesses 640 for each of the wafer regions is measured. Post-polished regions thicknesses 640 from the first polishing process are used as input data in a second phase 645 of the model development. A second polishing recipe 650 is carried out on platen 2 660, which can be the same as or different from that carried out on platen 1 620. Pad life and disk life factors 655 relating to the pad and conditioning disk used on platen 2 660 are also included in the model. Final thickness measurements 670 are taken and used in the model development. Thus, the method of the invention can accommodate a model that involves multiple polishing processes on multiple platens having different tool states and is able to provide platen-specific feedback 680 and 690 to platens 1 and 2, respectively. The model is extremely versatile and able to accommodate highly complex polishing scenarios.

Figure 5:
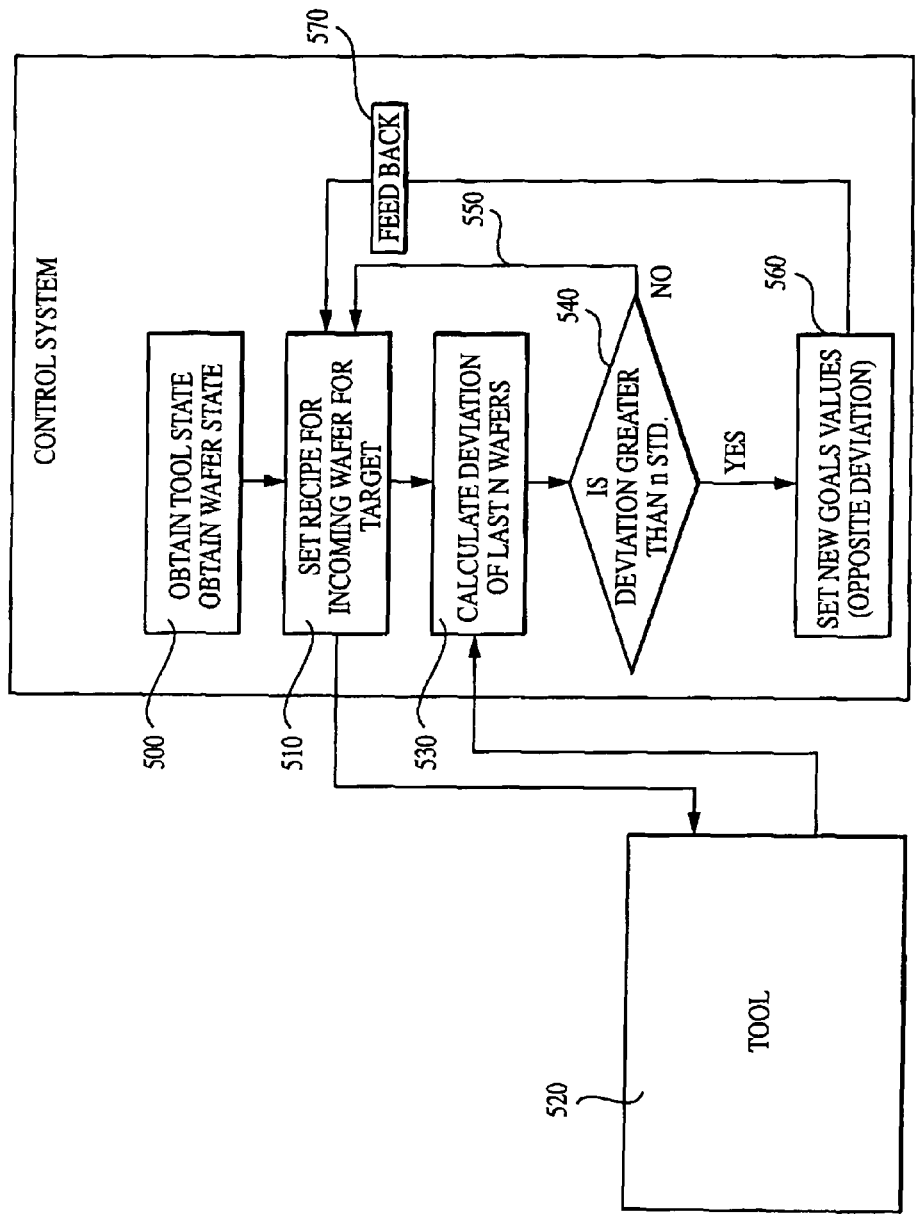
FIG. 5 is a flow diagram of the feedback loop used in a CMP polishing operation, as contemplated by at least some embodiments of the present invention.

According to at least some embodiments of the present invention, an initial model developed as described herein above is used in at least some embodiments of the present invention to control the run-to-run uniformity of the polishing process and to provide a feedback loop for updating the polishing recipe (FIG. 5). Briefly, one or more wafers is processed according to a first polishing recipe. A thickness measurement is taken across the polished wafer to obtain a wafer thickness profile, which is compared to the predicted wafer thickness profile calculated by the model. If the measured wafer thickness profile indicates deviation from the desired results, those deviations are used in an optimization process to update the polishing recipe. The updated recipe is then used in a feedback loop to progressively optimize the polishing recipe so as to improve or maintain within wafer film thickness uniformity.

According to the processing flow diagram in FIG. 5, initial processing conditions, e.g., tool state and wafer state are identified that will provide a desired wafer removal rate profile in step 500. The initial conditions may be determined empirically or by using the processing model of at least one embodiment of the present invention. If a processing model is used, a controller can use this model to calculate step times and processing parameters to polish an incoming profile to a target flat profile with a desired thickness as shown in step 510. Wafers are polished according to the initial polishing recipe in the CMP tool at step 520. The thickness of the polished wafer is measured and deviation from the predicted thickness is determined in step 530. In step 540 it is determined whether the deviation exceeds an established tolerance. If the deviation is within acceptable ranges, no changes are made to the polishing recipe and the controller instructs the tool to reuse the existing recipe in step 550. If the deviation is outside acceptable limits, new target parameters are set in step 560 and are feedback in step 570 into the controller where the polishing recipe is optimized according to an updated model that takes the deviation from the predicted value into consideration. The polishing step may be repeated and further updates of the polishing recipe are possible.

Process control of the CMP process according to at least one embodiment of the present invention permits optimization of the wafer removal rate for series of regions j across the wafer surface. By individually optimizing for the regions j of the wafer, greater control over the total surface is attainable. Thus, greater within wafer uniformity is achieved.

An exemplary optimization method, which can be used in determining an updated model for determining an updated polishing recipe, solves the equation:

$$\min_x f(y^{sp}, g(x)) \qquad (4)$$

where x is a vector of times and other processing parameters corresponding to the polishing recipe; g(x) is the model for the CMP process as described above in eqs. 1-3; $y^{sp}$ is a vector of the desired average region wafer thicknesses; and $f(y^{sp}, g(x))$ is some function which is meant to penalize the deviation between the model predictions g(x) and the desired thicknesses $y^{sp}$.

Thus, the optimization method suggests that the model need not correct for 100% of the deviation from predicted value. A penalty function may be used to reflect uncertainty in the measured or calculated parameters, or to "damp" the effect of changing parameters too quickly or to too great an extent. It is possible, for example, for the model to overcompensate for the measured deviations thereby necessitating another adjustment to react to the overcompensation. This leads to an optimization process that is jumpy and takes several iterations before the optimized conditions are realized.

Based upon this optimization method, the post-polishing wafer thickness is measured and the difference between the predicted thickness and the final thickness is determined. The error in prediction, also known as a bias, is then linearly added into the model such that the predicted final thickness more closely matches the actual final thickness. This bias is added to each region j, which is modeled as is shown in the following equation:

$$FT_j = IT_j - AR_j + b_j \qquad (5)$$

where $FT_j$ is the predicted final thickness of region j; $IT_j$ is the incoming thickness of region j; $AR_j$ is the predicted amount which is removed from region j given a set of recipe parameters; and $b_j$ is the bias term which arises due to the difference between the predicted and actual amount removed from region j. The process of linearly updating a model with bias terms based upon the difference between a model prediction and an actual measurement is part of at least some feedback controls in at least some embodiments of the present invention.

In at least some embodiment of the present invention, a feedback control combines the platens into a single model using the average of the tool states for each of the platens. The single model would use the feedback approach described above to apportion the bias adjustment across the different platens in some predetermined way.

Also, in at least some embodiments of the present invention, a feedback control scheme uses the final thickness measurements to distribute feedback individually to all of the platens. A method for modeling a polishing process for which different platens are separately modeled and factored into the model is shown in FIG. 6. Because each platen can be can be treated individually, the tool state, e.g., the pad life and disk life, and idle time, can be included in the model and feedback can be specific to the platen and polishing recipe. This feedback control scheme is particularly useful when different polishing recipes are being carried out on each platen. The ability to separately model each platen provides a greater of degree processing flexibility, since it allows one to change the processing recipe at one platen (during one stage of the polishing process) while keeping the processing recipe at the remaining platens unchanged.

In at least some embodiments of the present invention, the controller applies feedback individually to each carrier head. Each carrier head performs in a unique manner and it is possible in updating the polishing recipe to separately review the past performance of each wafer carrier and to adjust the updated parameters accordingly.

Feedback and feedforward control algorithms are constructed for use in the above control process based on the above models using various methods. The algorithms may be used to optimize parameters using various methods, such as recursive parameter estimation. Recursive parameter estimation is used in situations such as these, where it is desirable to model on line at the same time as the input-output data is received. Recursive parameter estimation is well suited for making decisions on line, such as adaptive control or adaptive predictions. For more details about the algorithms and theories of identification, see Ljung L., *System Identification—Theory for the User*, Prentice Hall, Upper Saddle River, N.J. 2nd edition, 1999.

In at least some embodiments of the present invention, the polishing recipe may be updated in discrete increments or steps defined in the algorithms of the developed by the model. Also, in at least some embodiments of the present invention, the updated polishing recipes may be determined by interpolation to the appropriate parameters.

Additional apparatus utilized to implement the feedforward and feedback loop include a film thickness measurement (metrology) tool to provide thickness data needed to calculate wafer material removal rate. The tool may be positioned on the polishing apparatus so as to provide in-line, in situ measurements, or it may be located remote from the polishing apparatus. The tool may use optical, electrical, acoustic or mechanical measurement methods. A suitable thickness measurement device is available from Nanometrics (Milpitas, Calif.) or Nova Measuring Instruments (Phoenix, Ariz.). A computer may be utilized to calculate the optimal pad conditioning recipe based upon the measured film thickness and calculated removal rate, employing the models and algorithm provided according to the invention. A suitable integrated controller and polishing apparatus (Mirra with iAPC or Mirra Mesa with iAPC) is available from Applied Materials, California.

Exemplary semiconductor wafers that can be polished using the concepts discussed herein including, but are not limited to those made of silicon, tungsten, aluminum, copper, BPSG, USG, thermal oxide, silicon-related films, and low k dielectrics and mixtures thereof.

The invention may be practiced using any number of different types of conventional CMP polishing pads. There are numerous polishing pads in the art that are generally made of urethane or other polymers. Exemplary polishing pads include Epic™ polishing pads (Cabot Microelectronics Corporation, Aurora Ill.) and Rodel® IC1000, IC1010, IC1400 polishing pads (Rodel Corporation, Newark, Del.), OXP series polishing pads (Sycamore Pad), Thomas West Pad 711, 813, 815, 815-Ultra, 817, 826, 828, 828-E1 (Thomas West).

Furthermore, any number of different types of slurry can be used in conjunction with aspects of the present invention. There are numerous CMP polishing slurries in the art, which are generally made to polish specific types of metals in semiconductor wafers. Exemplary slurries include Semi-Sperse® (available as Semi-Sperse® 12, Semi-Sperse® 25, Semi-Sperse® D7000, Semi-Sperse® D7100, Semi-Sperse® D7300, Semi-Sperse® P1000, Semi-Sperse® W2000, and Semi-Sperse® W2585) (Cabot Microelectronics Corporation, Aurora Ill.), Rodel ILD1300, Klebesol series, Elexsol, MSW1500, MSW2000 series, CUS series and PTS (Rodel).

Figure 7:
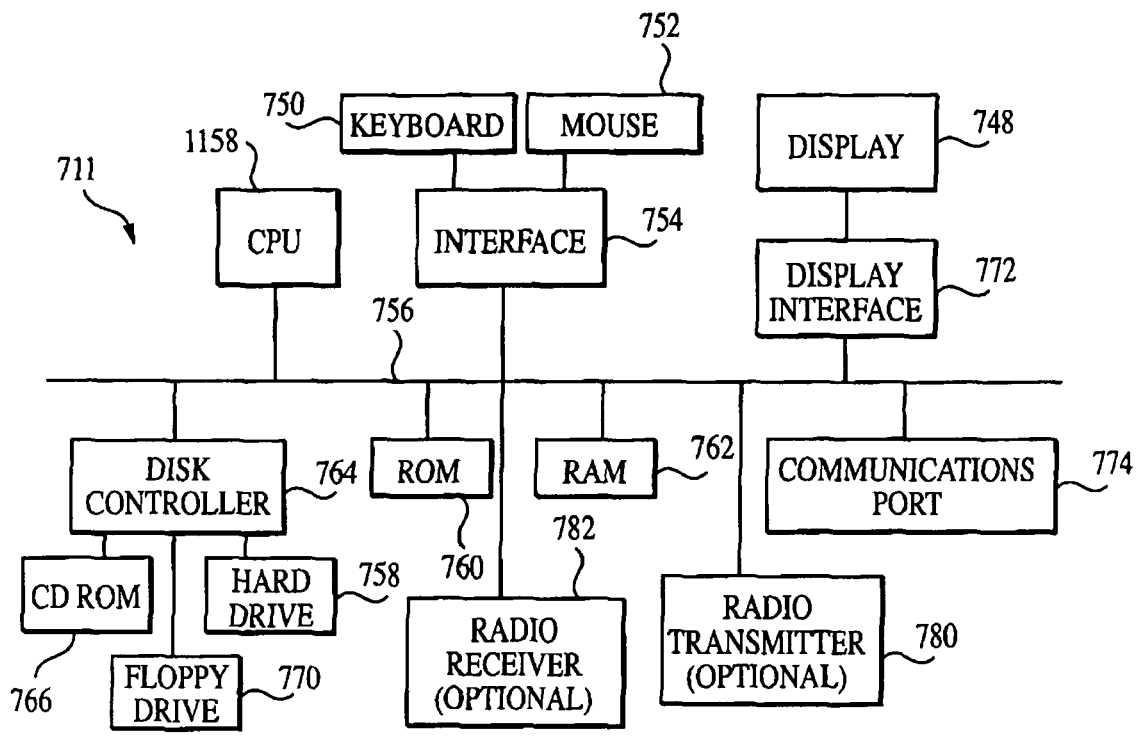
FIG. 7 is a block diagram of a computer system that includes tool representation and access control for use in at least some embodiments of the invention.

Various aspects of the present invention that can be controlled by a computer can be (and/or be controlled by) any number of control/computer entities, including the one shown in FIG. 7. Referring to FIG. 7 a bus 756 serves as the main information highway interconnecting the other components of system 711. CPU 758 is the central processing unit of the system, performing calculations and logic operations required to execute the processes of embodiments of the present invention as well as other programs. Read only memory (ROM) 760 and random access memory (RAM) 762 constitute the main memory of the system. Disk controller 764 interfaces one or more disk drives to the system bus 756. These disk drives are, for example, floppy disk drives 770, or CD ROM or DVD (digital video disks) drives 766, or internal or external hard drives 768. These various disk drives and disk controllers are optional devices.

A display interface 772 interfaces display 748 and permits information from the bus 756 to be displayed on display 748. Display 748 can be used in displaying a graphical user interface. Communications with external devices such as the other components of the system described above can occur utilizing, for example, communication port 774. Optical fibers and/or electrical cables and/or conductors and/or optical communication (e.g., infrared, and the like) and/or wireless communication (e.g., radio frequency (RF), and the like) can be used as the transport medium between the external devices and communication port 774. Peripheral interface 754 interfaces the keyboard 750 and mouse 752, permitting input data to be transmitted to bus 756. In addition to these components, system 711 also optionally includes an infrared transmitter and/or infrared receiver. Infrared transmitters are optionally utilized when the computer system is used in conjunction with one or more of the processing components/stations that transmits/receives data via infrared signal transmission. Instead of utilizing an infrared transmitter or infrared receiver, the computer system may also optionally use a low power radio transmitter 780 and/or a low power radio receiver 782. The low power radio transmitter transmits the signal for reception by components of the production process, and receives signals from the components via the low power radio receiver. The low power radio transmitter and/or receiver are standard devices in industry.

Although system 711 in FIG. 7 is illustrated having a single processor, a single hard disk drive and a single local memory, system 711 is optionally suitably equipped with any multitude or combination of processors or storage devices. For example, system 711 may be replaced by, or combined with, any suitable processing system operative in accordance with the principles of embodiments of the present invention, including sophisticated calculators, and hand-held, laptop/notebook, mini, mainframe and super computers, as well as processing system network combinations of the same.

Figure 8:
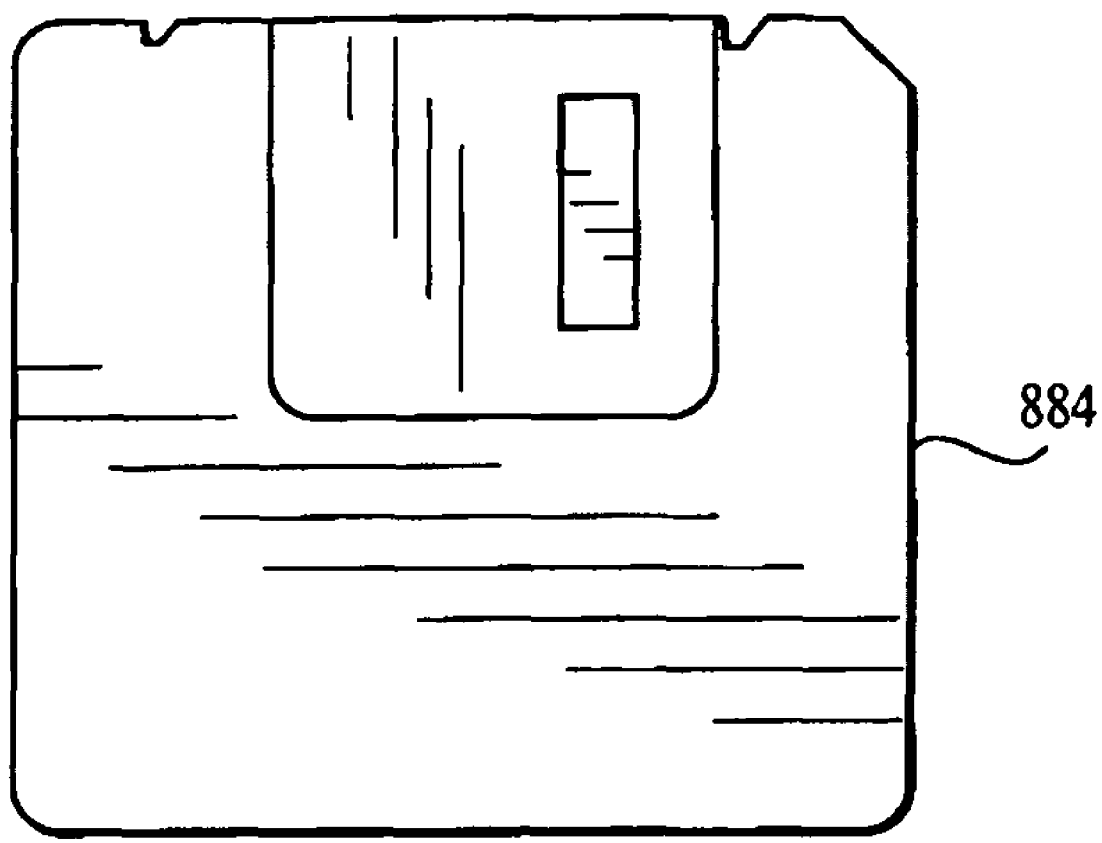
FIG. 8 is an illustration of a floppy disk that may store various portions of the software according to at least some embodiments of the invention.

FIG. 8 is an illustration of an exemplary computer readable memory medium 884 utilizable for storing computer readable code or instructions. As one example, medium 884 may be used with disk drives illustrated in FIG. 7. Typically, memory media such as floppy disks, or a CD ROM, or a digital video disk will contain, for example, a multi-byte locale for a single byte language and the program information for controlling the above system to enable the computer to perform the functions described herein. Alternatively, ROM 760 and/or RAM 762 illustrated in FIG. 7 can also be used to store the program information that is used to instruct the central processing unit 758 to perform the operations associated with the instant processes. Other examples of suitable computer readable media for storing information include magnetic, electronic, or optical (including holographic) storage, some combination thereof, etc. In addition, at least some embodiments of the present invention contemplate that the medium can be in the form of a transmission (e.g., digital or propagated signals).

In general, it should be emphasized that various components of embodiments of the present invention can be implemented in hardware, software or a combination thereof. In such embodiments, the various components and steps would be implemented in hardware and/or software to perform the functions of the present invention. Any presently available or future developed computer software language and/or hardware components can be employed in such embodiments of the present invention. For example, at least some of the functionality mentioned above could be implemented using the C, C++, or any assembly language appropriate in view of the processor(s) being used. It could also be written in an interpretive environment such as Java and transported to multiple destinations to various users.

Although various embodiments which incorporate the teachings of the present invention have been shown and described in detail herein, those skilled in the art can readily devise many other varied embodiments that incorporate these teachings.

What is claimed is:

1. An apparatus for polishing substrates, comprising:
at least one polishing station configured to polish a current wafer during a polishing process; and
a controller, operatively coupled to the at least one polishing station, configured to control the polishing station during the polishing process, to receive data relating to material removal rates for a plurality of substantially annular regions on the wafer, to predict a material removal rate for each of the plurality of substantially annular regions using a wafer polishing model that is based on measurement of one or more previous wafers that have completed at least one step of the polishing process, wherein the wafer polishing model defines an effect of a tool state of the at least one polishing station on polishing effectiveness based on applying a scaling factor that depends on pad life and disk life, to calculate differences between the predicted material removal rates and actual material removal rates that are determined based on the received data, to update the wafer polishing model based on the calculated differences, and to adjust a processing parameter of the polishing process based on the updated wafer polishing model.

2. The apparatus of claim 1, wherein the wafer polishing model defines the plurality of substantially annular regions on the wafer and identifies a distinct material removal rate in a polishing step of the polishing process for each of the substantially annular regions, wherein the polishing process comprises a plurality of polishing steps.

3. The apparatus of claim 2, wherein the received data includes polishing time.

4. The apparatus of claim 2, wherein the received data includes at least one of polishing time, polishing pad down forces and velocity, slurry flow and composition, conditioning time, conditioning disk down forces and velocity, or oscillating speeds of a conditioning disk and a wafer carrier.

5. The apparatus of claim 1, wherein the wafer removal for a region j ($AR'_j$) in the wafer polishing model is determined according to the equation:

$$AR'_j = (c_{11j} \cdot x_1 + c_{12j}) \cdot t_1 + (c_{21j} \cdot x_2 + c_{22j}) \cdot t_2 + (c_{31j} \cdot x_3 + c_{32j}) \cdot t_3 + (c_{41j} \cdot x_1 + c_{42j}) \cdot t_4 + (c_{51j} \cdot x_5 + c_{52j}) \cdot t_5,$$

where $x_1$, $x_2$, $x_3$, $x_4$, and $x_5$ are the additional parameter values for polishing steps 1, 2, 3, 4, and 5, respectively; $t_1$, $t_2$, $t_3$, $t_4$, and $t_5$ are the polishing times for polishing steps 1, 2, 3, 4, and 5, respectively, and $c_{a1j}$ provides the contribution to wafer removal of the variable x in polishing step a in region j; and $c_{a2j}$ provides the contribution to wafer removal of polishing time in polishing step a.

6. The apparatus of claim 1, wherein the scaling factor is:

$$(1+k_p \cdot t_p + k_d \cdot t_d + k_{pd} \cdot t_p \cdot t_d),$$

where the terms $t_p$ and $t_d$ refer to pad and disk life, respectively; and the terms $k_p$, $k_d$ and $k_{pd}$ are empirically determined coefficients relating pad and disk life to removal rate.

7. The apparatus of claim 1, wherein the wafer polishing model defines four or more substantially annular regions.

8. The apparatus of claim 1, further comprising:
a plurality of polishing stations, each of the plurality of polishing stations configured to polish the wafer during a distinct polishing step of the polishing process.

9. The apparatus of claim 8, wherein the plurality of polishing stations includes at least three polishing stations and the polishing process includes instructions for polishing the wafer at each of the at least three polishing stations.

10. The apparatus of claim 8, wherein the polishing process includes instructions to process the wafer in the same manner on at least two of the plurality of polishing stations.

11. The apparatus of claim 8, wherein the polishing process includes instructions to process the wafer in a different manner on at least two of the plurality of polishing stations.

12. The apparatus of claim 8, wherein the controller is configured to, for each of the plurality of polishing stations, receive distinct data of the wafer processed by the polishing station, predict distinct material removal rates using a distinct wafer polishing model associated with the processing station, calculate differences between the predicted material removal rates and actual material removal rates that are determined based on the distinct received data, update the distinct wafer polishing model based on the calculated differences, and adjust an processing parameter of the polishing process associated with the polishing station based on the updated distinct wafer polishing model.

13. The apparatus of claim 12, wherein a separate polishing process is associated with each of the plurality of polishing stations.

14. An apparatus comprising:
at least one polishing station configured to polish a current wafer; and
a control station configured to use a polishing recipe to control the at least one polishing station to polish the wafer, wherein the polishing recipe is based on a wafer polishing model that defines a plurality of substantially annular regions on a wafer and identifies a wafer material removal rate in a polishing step for each of the regions, wherein the wafer polishing model is based on measurements of one or more previous wafers that have completed the polishing step, wherein the wafer polishing model defines an effect of a tool state of the at least one polishing station on polishing effectiveness based on applying a factor that depends on pad life and disk life, and wherein the wafer polishing model generates a target thickness profile for each region.

15. The apparatus of claim 14, wherein the polishing recipe is based on the wafer polishing model and an initial wafer thickness profile.

16. The apparatus of claim 14, wherein the plurality of substantially annular regions includes regions extending radially outward from a center point of the wafer.

\* \* \* \* \*